United States Patent
Noda et al.

(10) Patent No.: US 12,368,042 B2
(45) Date of Patent: Jul. 22, 2025

(54) PRECURSORS AND PROCESSES FOR DEPOSITION OF Si-CONTAINING FILMS USING ALD AT TEMPERATURE OF 550° C. OR HIGHER

(71) Applicant: L'Air Liquide, Société Anonyme pour l'Etude et l'Exploitation des Procédés Georges Claude, Paris (FR)

(72) Inventors: Naoto Noda, Yokosuka (JP); Naohisa Nakagawa, Yokosuka (JP); Jean-Marc Girard, Versailles (FR); Zhiwen Wan, Plano, TX (US); Takio Kizu, Yokosuka (JP)

(73) Assignee: L'Air Liquide, Société Anonyme pour l'Etude et l'Exploitation des Procédés Georges Claude, Paris (FR)

(*) Notice: Subject to any disclaimer, the term of this patent is extended or adjusted under 35 U.S.C. 154(b) by 654 days.

(21) Appl. No.: 17/416,990

(22) PCT Filed: Dec. 13, 2019

(86) PCT No.: PCT/US2019/066333
§ 371 (c)(1),
(2) Date: Jun. 21, 2021

(87) PCT Pub. No.: WO2020/131635
PCT Pub. Date: Jun. 25, 2020

(65) Prior Publication Data
US 2022/0076947 A1    Mar. 10, 2022

Related U.S. Application Data

(60) Provisional application No. 62/783,473, filed on Dec. 21, 2018.

(51) Int. Cl.
*H01L 21/02* (2006.01)
*C23C 16/34* (2006.01)
*C23C 16/455* (2006.01)

(52) U.S. Cl.
CPC ...... *H01L 21/02222* (2013.01); *C23C 16/345* (2013.01); *C23C 16/45553* (2013.01); *H01L 21/0217* (2013.01); *H01L 21/0228* (2013.01)

(58) Field of Classification Search
CPC .......... H01L 21/02222; H01L 21/0217; H01L 21/0228; H01L 21/02164; H01L 21/02274;
(Continued)

(56) References Cited

U.S. PATENT DOCUMENTS 5,262,553 A * 11/1993 Bujalski .................... C07F 7/10
528/5
8,460,753 B2    6/2013 Xiao et al.
(Continued)

FOREIGN PATENT DOCUMENTS

JP    2005 213633         8/2005
JP    2007005365 A  *  1/2007  ........... C23C 16/401
(Continued)

OTHER PUBLICATIONS

Formation of High Dielectric Constant Films for Semiconductor Device Manufacture Involves Forming Film Comprises Metal Silicate on Substrate Using Gas of Silicon-containing Compound and Gas of Metal-containing Compound (Year: 2007).*
(Continued)

*Primary Examiner* — Dale E Page
*Assistant Examiner* — Quovaunda Jefferson
(74) *Attorney, Agent, or Firm* — Yan Jiang

(57) ABSTRACT

Methods for forming a Si-containing film on a substrate comprise heating the substrate to a temperature higher than
(Continued)

≤50° C., exposing the substrate to a vapor including a Si-containing film forming composition containing a Si-containing precursor having the formula: $SiR^1_yR^2_{4-x-y}(NH-SiR'_3)_x$, wherein x=2, 3, 4; y=0, 1, 2, $R^1$ and $R^2$ each are independently selected from H, a halogen (Cl, Br, I), an $C_1$-$C_4$ alkyl, an isocyanate, a $C_1$-$C_4$ alkoxide, or an —$NR^3R^4$ group in which $R^3$ and $R^4$ each are independently selected from H, a $C_1$-$C_4$ alkyl, provided that if $R^3$=H, $R^4$>$C_1$; each R' is independently selected from H, a halogen (Cl, Br, I), or a $C_1$-$C_4$ alkyl, and depositing the Si-containing precursor onto the substrate to form the Si-containing film on the substrate through an ALD process. The Si-containing precursor may be selected from $SiH_2(NH-Si(CH_3)_3)_2$, $SiHCl(NH-Si(CH_3)_3)_2$, $SiCl_2(NH-Si(CH_3)_3)_2$, $SiH(NH-Si(CH_3)_3)_3$, $SiCl(NH-Si(CH_3)_3)_3$, or $Si(NH-Si(CH_3)_3)_4$.

14 Claims, 17 Drawing Sheets

(58) Field of Classification Search
CPC ............ C23C 16/345; C23C 16/45553; C23C 16/401; C23C 16/402; C23C 16/45527
See application file for complete search history.

(56) References Cited

U.S. PATENT DOCUMENTS

| | | | |
|---|---|---|---|
| 9,460,912 | B2 | 10/2016 | Chandra et al. |
| 2007/0160774 | A1* | 7/2007 | Tsukada ............ H01L 21/02271 |
| | | | 438/791 |
| 2009/0075490 | A1 | 3/2009 | Dussarrat |
| 2013/0295779 | A1* | 11/2013 | Chandra ............. H01L 21/0228 |
| | | | 546/14 |
| 2015/0299848 | A1 | 10/2015 | Haukka et al. |
| 2016/0225616 | A1 | 8/2016 | Li et al. |
| 2017/0207082 | A1 | 7/2017 | Wang et al. |
| 2017/0335449 | A1 | 11/2017 | Li et al. |

FOREIGN PATENT DOCUMENTS

| | | |
|---|---|---|
| TW | I489547 | 6/2015 |
| TW | 201630726 | 9/2016 |
| WO | WO 2009 087609 | 7/2009 |
| WO | WO 2018 063907 | 4/2018 |

OTHER PUBLICATIONS

Brauer, D.J. et al., Tris(trimethylsilylamino)silanes RSi(NHSiMe$_3$)$_3$. Synthesis, crystal and molecular structure of three dimeric trilithio derivatives, J. Organometallic Chemistry, 287 (1985), 305-320.

* cited by examiner

PRECURSORS AND PROCESSES FOR DEPOSITION OF Si-CONTAINING FILMS USING ALD AT TEMPERATURE OF 550° C. OR HIGHER

CROSS REFERENCE TO RELATED APPLICATIONS

The present application is a 371 of PCT Application PCT/US2019/066333, filed Dec. 13, 2019, which claims the benefits of U.S. Provisional Patent Application Nos. 62/783,473 filed Dec. 21, 2018 and No. 62/900,473 filed Sep. 16, 2019, being incorporated herein by references in their entireties for all purposes.

TECHNICAL FIELD

Disclosed are precursors and processes for deposition of Si-containing films using an atomic layer deposition (ALD) process at a temperature of 550° C. or higher, preferably, from greater than 550° C. to no more than 750° C., in semiconductor manufacturing processes.

BACKGROUND

Si-containing films, such as $SiO_2$ and SiN, are essential functional compositions in semiconductor devices, including 3D-NAND flash memory, and are embedded as inter-poly dielectric, blocking oxide tunnel oxide layer, and pillar. $SiO_2$ films play various functions in semiconductor devices. A high quality of $SiO_2$ films, which resists etching by cleaning processes and doesn't shrink during exposure to high temperature subsequent annealing and processing steps, is required. In 3D NAND manufacturing and other semiconductor device manufacturing, an ALD is the key deposition technology for fabricating ultra-thin films (typically from an atomic monolayer to a few tenths of a nanometer) in a perfectly conformal fashion. The ALD of $SiO_2$ provides uniform coverage and defined composition of $SiO_2$ layers in semiconductor fabrication, specifically for trench and holes filling with high aspect ratio (HAR), which are common structures for current semiconductor devices. For example, holes in a 3D-NAND device have an aspect ratio ranging from 30:1 to 150:1. The deposition of a high quality and conformal $SiO_2$ layer over the trench deposited by ALD remains a great challenge due to limited precursors, especially for ALD at a temperature higher than 500° C. At high temperature (>500° C.), most $SiO_2$ ALD precursors tend not to exhibit a perfect ALD, i.e. self-limited growth behavior. Instead, parasitic chemical vapor deposition (CVD) (i.e. non self-limited growth) caused by the thermal decomposition of the precursor typically leads to poor film quality, contamination, and non-conformal growth, with thicker film at the top of the structure compared to the side and bottom of holes or trenches. High temperature ALD is however desirable because depositing the film at an elevated temperature prevents the shrinkage that is normally observed when a film is deposited at lower temperature (around 500° C.) and then annealed after deposition at a higher temperature (approximately 600-900° C.), or simply exposed to high temperature in later processing steps. Such heat shrinkage induces stress and potential cracking. However, the industry and researchers have struggled to discover molecules that are sufficiently thermally stable to perform a high temperature (>500° C.) ALD deposition of $SiO_2$ film, and exhibit proper surface reactivity to enable a self-limited growth behavior of ALD at these higher temperatures.

Efforts to find thermal $SiO_2$ ALD precursors suitable for ALD processes at a temperature higher than 500° C. have been attempted.

US2017207082 to Wang et al. disclosed a method and composition for depositing a silicon oxide film in an ALD process at temperatures of 650° C. or greater. The Si precursors I or II used in the ALD process for depositing a SiO film were:

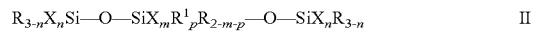

wherein X=Cl, Br, or I; R and $R^1$ each are independently selected from a hydrogen atom, a $C_1$ to $C_3$ alkyl group; n=1, 2, or 3; m=0, 1, or 2; and p=0 or 1.

US2016225616 to Li et al. discloses method and precursors for manufacturing 3D devices including $SiO_2$ or SiN film formation for forming the apparatus, for example, with silicon precursor selected from the compounds having Formulae I through III as 3D vertical NAND flash memory stacks. The deposition processes include ALD at one or more temperatures ranging from ambient temperature to 1000° C.

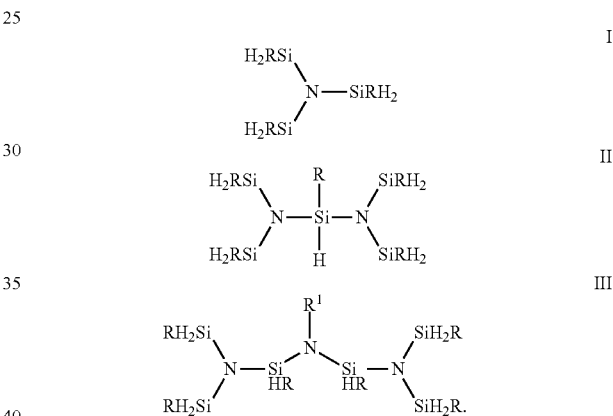

U.S. Pat. No. 9,460,912 to Chandra et al. discloses composition(s) and ALD process(es) for the formation of a silicon oxide containing film at one or more deposition temperature from 600 to 800° C. and pressure ranges from 50 mTorr to 760 Torr. In one aspect, the composition and process use one or more silicon precursors selected from compounds having the following formulae I, II, described and combinations thereof

U.S. Pat. No. 8,460,753 to Xiao et al. discloses methods for depositing silicon dioxide or silicon oxide films that have extremely low wet etch rate in HF solution using a thermal CVD process, ALD process or cyclic CVD process with a silicon precursor selected from one of: $R^1{}_nR^2{}_m Si(NR^3R^4)_{4-n-m}$; and, a cyclic silazane of $(R^1R^2SiNR^3)_p$, where $R^1$ is an alkenyl or an aromatic, such as vinyl, allyl, and phenyl; $R^2$, $R^3$, and $R^4$ are selected from H, alkyl with $C_1$-$C_{10}$, linear, branched, or cyclic, an alkenyl with $C_2$-$C_{10}$ linear, branched, or cyclic, and aromatic; n=1-3, m=0-2; p=3-4. The temperature range was between 400° C. to 700° C. under a pressure of 100 mT to 1T.

WO18063907 to Hwang et al. discloses chlorodisilazanes, silicon-heteroatom compounds and deposition processes including ALD process of using those compounds for forming silicon-heteroatom compound as a film including silicon oxide. The syntheses of 1,1,1,3,3-pentachlorodisilazane, 1,1,3,3-tetrachlorodisilazane or 1,1,1,3,3,3-hexachlorodisilazane was disclosed. 1,1,1,3,3,3-hexachlorodisilazane used for deposition of silicon nitride film with PEALD at a temperature range of 350 to 500° C. was disclosed.

US20070160774 or JP 2005213633 patent application to Tsukada et al. discloses SiN films formed by an aminosilane gas represented by $(H)_n$—Si—$[N(R^1)_2]_{4-n}$ ($R^1$=H, $C_{1-4}$ alkyl, trimethylsilyl; n=0-3; all of R are not H) and a hydrazine gas represented by $N_2(H)_{4-x}(R^2)_x$ ($R^2$=Me, Et, Ph; x=0-4) in a CVD chamber at low temperature without generation of ammonium chloride.

Discovery of new and novel ALD precursors that are applicable to the ALD processes at high temperatures, typically >500° C., and preferably around 700° C. or higher, is challenging, since their applications to ALD processes achievable at higher temperatures require high step coverage (SC) and low wet etch rate (WER). Thus, there are needs to provide such precursors to meet these requirements.

SUMMARY

Disclosed are methods to form a Si-containing film on a substrate. The method comprises the steps of heating the substrate in a reactor to a temperature of 550° C. or higher, exposing the substrate to a vapor including a Si-containing film forming composition that contains a Si-containing precursor having the formula:

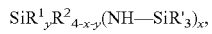

$$SiR^1_yR^2_{4-x-y}(NH-SiR'_3)_x,$$

wherein x=2, 3, 4; y=0, 1, 2, $R^1$ and $R^2$ each are independently selected from H, a halogen (Cl, Br, I), an $C_1$-$C_4$ alkyl, an isocyanate, a $C_1$-$C_4$ alkoxide, or an —$NR^3R^4$ group in which $R^3$ and $R^4$ each are independently selected from H, a $C_1$-$C_4$ alkyl, provided that if $R^3$=H, $R^4$>$C_1$; each R' is independently selected from H, a halogen (Cl, Br, I), or a $C_1$-$C_4$ alkyl, and depositing at least part of the Si-containing precursor onto the substrate to form the Si-containing film on the substrate through an ALD process.

Also, the method comprises the steps of heating a substrate in a reactor to a temperature of higher than 550° C., and forming a chemisorbed and/or physisorbed film, on the surface of the substrate, of a Si-containing precursor having the formula:

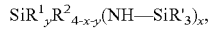

$$SiR^1_yR^2_{4-x-y}(NH-SiR'_3)_x,$$

wherein x=2, 3, 4; y=0, 1, 2, $R^1$ and $R^2$ each are independently selected from H, a halogen (Cl, Br, I), an $C_1$-$C_4$ alkyl, an isocyanate, a $C_1$-$C_4$ alkoxide, or an —$NR^3R^4$ group in which $R^3$ and $R^4$ each are independently selected from H, a $C_1$-$C_4$ alkyl, provided that if $R^3$=H, $R^4$>$C_1$; each R' is independently selected from H, a halogen (Cl, Br, I), or a $C_1$-$C_4$ alkyl.

The disclosed methods may include one or more of the following aspects:
 the method further comprising the step of chemically reacting the chemisorbed and/or physisorbed film comprising the Si-containing precursor with a co-reactant;
 the co-reactant reacting with the Si-containing precursor in the chemisorbed and/or physisorbed film producing a reaction product that forms a second film on the surface of the substrate;
 the method further comprising the step of exposing the substrate to the co-reactant;
 the method further comprising the step of introducing the co-reactant to the reactor;
 the co-reactant being selected from $O_3$, $O_2$, $H_2O$, NO, $N_2O$, $NO_2$, $H_2O_2$, O radicals & combinations thereof;
 the co-reactant is $O_2$;
 the co-reactant is $O_3$;
 the co-reactant being selected from $NH_3$, NO, $N_2O$, hydrazines, $N_2$ plasma, $N_2/H_2$ plasma, $NH_3$ plasma, amines and combinations thereof;
 the co-reactant is $NH_3$;
 the method further comprising the step of heating the reactor containing the substrate to a temperature approximately 400° C. or higher;
 the method further comprising the step of heating the substrate to a temperature from approximately 550° C. to approximately 750° C.;
 the method further comprising the step of heating the substrate to a temperature from greater than 550° C. to no more than 750° C.;
 the method further comprising the step of heating the substrate to a temperature approximately 550° C. to approximately 650° C.
 the method further comprising the step of heating the substrate to a temperature greater than 550° C. to no more than 650° C.
 the silicon-containing film being a film of $Si_aO_bC_cN_d$, where a>0; b, c, d≥0.
 the silicon-containing film containing H in a low concentration;
 the silicon-containing film is a silicon oxide layer;
 the silicon-containing film is a silicon nitride layer;
 a WER of the silicon oxide film as deposited, normalized with thermal $SiO_2$ formed, being less than 4;
 a WER of the silicon oxide film as deposited, normalized with thermal $SiO_2$, being from 2 to 4;
 the substrate being a wafer with patterns;
 the substrate being a wafers with holes or trenches having an aspect ratio larger than 10:1;
 the substrate being a wafers with holes or trenches having an aspect ratio larger than 24:1;
 the silicon-containing film being part of a flash memory device;
 the silicon oxide film being part of a flash memory device;
 the Si-containing precursor being selected from $SiH_2(NH-Si(CH_3)_3)_2$, $SiHCl(NH-Si(CH_3)_3)_2$, $SiCl_2(NH-Si(CH_3)_3)_2$, $SiH(NH-Si(CH_3)_3)_3$, $SiCl(NH-Si(CH_3)_3)_3$, or $Si(NH-Si(CH_3)_3)_4$;
 the Si-containing precursor being $SiH_2(NH-Si(CH_3)_3)_2$;
 the Si-containing precursor being $SiHCl(NH-Si(CH_3)_3)_2$;
 the Si-containing precursor being $SiCl_2(NH-Si(CH_3)_3)_2$;
 the Si-containing precursor being $SiH(NH-Si(CH_3)_3)_3$;
 the Si-containing precursor being $SiCl(NH-Si(CH_3)_3)_3$;
 the Si-containing precursor being $Si(NH-Si(CH_3)_3)_4$;
 the pyrolysis temperature for $H_2Si(NH-SiMe_3)_2$ being approximately 600° C.;
 $H_2Si(NH-SiMe_3)_2$ performing a perfect ALD in a temperature range between approximately 550° C. to approximately 650° C.;
 $H_2Si(NH-SiMe_3)_2$ performing a perfect ALD at a temperature of approximately 650° C.;
 $H_2Si(NH-SiMe_3)_2$ keeping conformal growth at a temperature higher than approximately 550° C.;
 $H_2Si(NH-SiMe_3)_2$ keeping conformal growth at a temperature of approximately 650° C.;
 the pyrolysis temperature for $HSi(NH-SiMe_3)_3$ being approximately 700° C.;

HSi(NH—SiMe$_3$)$_3$ performing a perfect ALD in a temperature range between approximately 550° C. to approximately 750° C.;

HSi(NH—SiMe$_3$)$_3$ performing a perfect ALD at a temperature of approximately 700° C.;

HSi(NH—SiMe$_3$)$_3$ keeping conformal growth at a temperature higher than approximately 550° C.;

HSi(NH—SiMe$_3$)$_3$ keeping conformal growth at a temperature of approximately 700° C.;

The temperature range of the reactor being from approximately 200° C. to approximately 1000° C.;

The temperature range of the reactor being from approximately 400° C. to approximately 800° C.;

the deposition temperature ranging from approximately 400° C. to approximately 800° C. for a thermal process;

the deposition temperature ranging from approximately 500° C. to approximately 750° C. for a thermal process;

the deposition temperature ranging from approximately 550° C. to approximately 700° C. for a thermal process.

the pressure in the reactor being held between approximately 0.1 mTorr and approximately 1000 Torr;

the pressure in the reactor being held between approximately 0.1 Torr and approximately 400 Torr;

the pressure in the reactor being held between approximately 1 Torr and approximately 100 Torr;

the pressure in the reactor being held between approximately 1 Torr and approximately 10 Torr;

the ALD process being a thermal ALD;

the ALD process being a spatial ALD; and the ALD process being a temporal ALD.

Also, disclosed is a composition for deposition of a film comprising a Si-containing precursor having the formula:

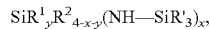

wherein x=2, 3, 4; y=0, 1, 2, R$^1$ and R$^2$ each are independently selected from H, a halogen (Cl, Br, I), an C$_1$-C$_4$ alkyl, an isocyanate, a C$_1$-C$_4$ alkoxide, or an —NR$^3$R$^4$ group in which R$^3$ and R$^4$ each are independently selected from H, a C$_1$-C$_4$ alkyl, provided that if R$^3$=H, then R$^4$>C$_1$; each R' is independently selected from H, a halogen (Cl, Br, I), or a C$_1$-C$_4$ alkyl, provided that if x=2 and y=1, then R$^1$=H and R$^2$≠H, or R$^2$=H and R$^1$≠H; further provided that if x=3 and y=1, then R$^1$≠H. The disclosed compositions include one or more of the following aspects:

the Si-containing precursor being selected from SiH$_2$(NH—Si(CH$_3$)$_3$)$_2$, SiH(NH—Si(CH$_3$)$_3$)$_3$, SiHCl(NH—Si(CH$_3$)$_3$)$_2$, SiCl$_2$(NH—Si(CH$_3$)$_3$)$_2$, SiCl(NH—Si(CH$_3$)$_3$)$_3$, or Si(NH—Si(CH$_3$)$_3$)$_4$;

the Si-containing precursor being SiH$_2$(NH—Si(CH$_3$)$_3$)$_2$;

the Si-containing precursor being SiH(NH—Si(CH$_3$)$_3$)$_3$;

the Si-containing precursor being SiHCl(NH—Si(CH$_3$)$_3$)$_2$;

the Si-containing precursor being SiCl$_2$(NH—Si(CH$_3$)$_3$)$_2$;

the Si-containing precursor being SiCl(NH—Si(CH$_3$)$_3$)$_3$;

the Si-containing precursor being Si(NH—Si(CH$_3$)$_3$)$_4$;

the Si-containing precursor having a purity ranging from approximately 93% w/w to approximately 100% w/w; and the Si-containing precursor having a purity ranging from approximately 99% w/w to approximately 99.999% w/w.

Notation and Nomenclature

The following detailed description and claims utilize a number of abbreviations, symbols, and terms, which are generally well known in the art, and include:

As used herein, the indefinite article "a" or "an" means one or more.

As used herein, "about" or "around" or "approximately" in the text or in a claim means±10% of the value stated.

As used herein, "room temperature" in the text or in a claim means from approximately 20° C. to approximately 25° C.

The term "ambient temperature" refers to an environment temperature approximately 20° C. to approximately 25° C.

As used in the disclosed embodiments, the term "independently" when used in the context of describing R groups should be understood to denote that the subject R group is not only independently selected relative to other R groups bearing the same or different subscripts or superscripts, but is also independently selected relative to any additional species of that same R group. For example in the formula MR$^1_x$(NR$^2$R$^3$)$_{(4-x)}$, where x is 2 or 3, the two or three R$^1$ groups may, but need not be identical to each other or to R$^2$ or to R$^3$. Further, it should be understood that unless specifically stated otherwise, values of R groups are independent of each other when used in different formulas.

As used in the disclosed embodiments, the term "hydrocarbyl group" refers to a functional group containing carbon and hydrogen; the term "alkyl group" refers to saturated functional groups containing exclusively carbon and hydrogen atoms. The hydrocarbyl group may be saturated or unsaturated. Either term refers to linear, branched, or cyclic groups. Examples of linear alkyl groups include without limitation, methyl groups, ethyl groups, propyl groups, butyl groups, etc. Examples of branched alkyls groups include without limitation, t-butyl. Examples of cyclic alkyl groups include without limitation, cyclopropyl groups, cyclopentyl groups, cyclohexyl groups, etc.

As used in the disclosed embodiments, the abbreviation "Me" refers to a methyl group; the abbreviation "Et" refers to an ethyl group; the abbreviation "Pr" refers to a propyl group.

Any and all ranges recited in the disclosed embodiments are inclusive of their endpoints (i.e., x=1 to 4 or x ranges from 1 to 4 includes x=1, x=4, and x=any number in between), irrespective of whether the term "inclusively" is used.

The term "substrate" refers to a material or materials on which a process is conducted. The substrate may refer to a wafer having a material or materials on which a process is conducted. The substrates may be any suitable wafer used in semiconductor, photovoltaic, flat panel, or LCD-TFT device manufacturing. The substrate may also have one or more layers of differing materials already deposited upon it from a previous manufacturing step. For example, the wafers may include silicon layers (e.g., crystalline, amorphous, porous, etc.), silicon containing layers (e.g., SiO$_2$, SiN, SiON, SiCOH, etc.), metal containing layers (e.g., copper, cobalt, ruthenium, tungsten, platinum, palladium, nickel, ruthenium, gold, etc.), an organic layer such as amorphous carbon, or a photoresist, or combinations thereof. Furthermore, the substrate may be planar or patterned. The substrate may include layers of oxides which are used as dielectric materials in MEMS, 3D NAND, MIM, DRAM, or FeRam device applications (for example, ZrO$_2$ based materials, HfO$_2$ based materials, TiO$_2$ based materials, rare earth oxide based materials, ternary oxide based materials, etc.) or nitride-based films (for example, TaN, TiN, NbN) that are used as electrodes. One of ordinary skill in the art will recognize that the terms "film" or "layer" used herein refer to a thickness of some material laid on or spread over a surface and that the surface may be a trench or a line.

Throughout the specification and claims, the wafer and any associated layers thereon are referred to as substrates.

The term "wafer" or "patterned wafer" refers to a wafer having a stack of silicon-containing films on a substrate and a patterned hardmask layer on the stack of silicon-containing films formed for pattern etch. The term "wafer" or "patterned wafer" may also refers to a trench wafer having an aspect ratio.

Note that herein, the terms "film" and "layer" may be used interchangeably. It is understood that a film may correspond to, or related to a layer, and that the layer may refer to the film. Furthermore, one of ordinary skill in the art will recognize that the terms "film" or "layer" used herein refer to a thickness of some material laid on or spread over a surface and that the surface may range from as large as the entire wafer to as small as a trench or a line.

Note that herein, the terms "deposition temperature" and "substrate temperature" may be used interchangeably. It is understood that a substrate temperature may correspond to, or be related to a deposition temperature, and that the deposition temperature may refer to the substrate temperature.

Note that herein, the terms "precursor" and "deposition compound" and "deposition gas" may be used interchangeably when the precursor is in a gaseous state at room temperature and ambient pressure. It is understood that a precursor may correspond to, or be related to a deposition compound or deposition gas, and that the deposition compound or deposition gas may refer to the precursor.

As used herein, the abbreviation "NAND" refers to a "Negated AND" or "Not AND" gate; the abbreviation "2D" refers to 2 dimensional gate structures on a planar substrate; the abbreviation "3D" refers to 3 dimensional or vertical gate structures, wherein the gate structures are stacked in the vertical direction.

The standard abbreviations of the elements from the periodic table of elements are used herein. It should be understood that elements might be referred to by these abbreviation (e.g., Si refers to silicon, N refers to nitrogen, 0 refers to oxygen, C refers to carbon, H refers to hydrogen, F refers to fluorine, etc.).

The unique CAS registry numbers (i.e., "CAS") assigned by the Chemical Abstract Service are provided to identify the specific molecules disclosed.

Please note that the silicon-containing films, such as SiN and SiO, are listed throughout the specification and claims without reference to their proper stoichiometry. The silicon-containing films may include pure silicon (Si) layers, such as crystalline Si, poly-silicon (p-Si or polycrystalline Si), or amorphous silicon; silicon nitride ($Si_kN_l$) layers; or silicon oxide ($Si_nO_m$) layers; or mixtures thereof, wherein k, l, m, and n, inclusively range from 0.1 to 6. Preferably, silicon nitride is $Si_kN_l$, where k and l each range from 0.5 to 1.5. More preferably silicon nitride is $Si_3N_4$. Herein, SiN in the following description may be used to represent $Si_kN_l$ containing layers. Preferably silicon oxide is $Si_nO_m$, where n ranges from 0.5 to 1.5 and m ranges from 1.5 to 3.5. More preferably, silicon oxide is $SiO_2$. Herein, SiO in the following description may be used to represent $Si_nO_m$ containing layers. The silicon-containing film could also be a silicon oxide based dielectric material such as organic based or silicon oxide based low-k dielectric materials such as the Black Diamond II or III material by Applied Materials, Inc. with a formula of SiOCH. Silicon-containing film may also include $Si_aO_bN_c$ where a, b, c range from 0.1 to 6. The silicon-containing films may also include dopants, such as B, C, P, As and/or Ge.

Ranges may be expressed herein as from about one particular value, and/or to about another particular value. When such a range is expressed, it is to be understood that another embodiment is from the one particular value and/or to the other particular value, along with all combinations within said range.

Reference herein to "one embodiment" or "an embodiment" means that a particular feature, structure, or characteristic described in connection with the embodiment may be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein.

DESCRIPTION OF PREFERRED EMBODIMENTS

Figure 1:
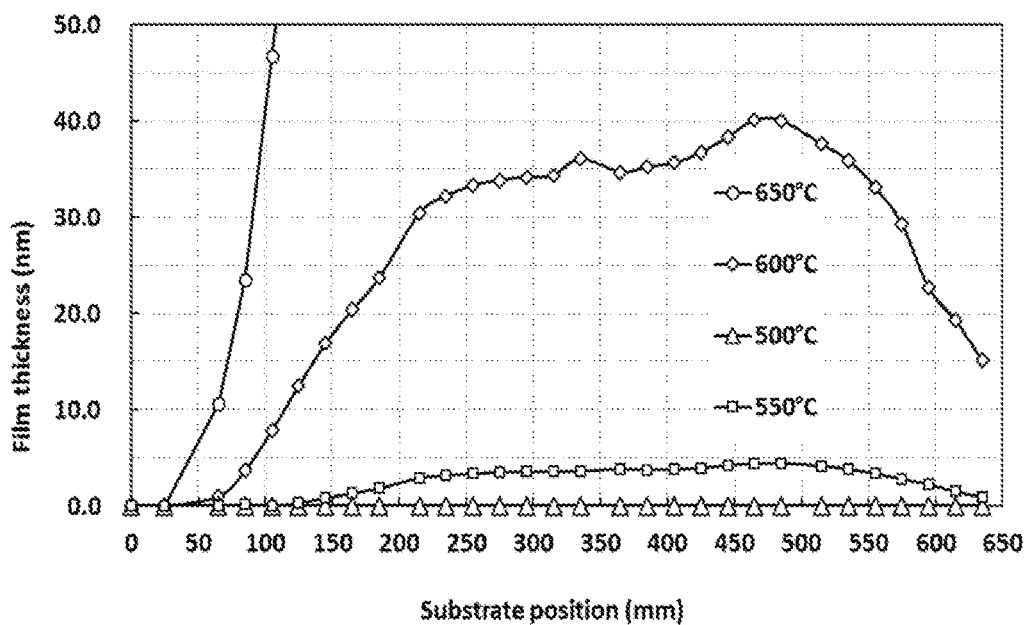
FIG. 1 is a self-decomposition curve of BTBAS in the gas phase (pyrolysis test)

Disclosed are precursors and processes for deposition of Si-containing films using an ALD process at a temperature preferably higher than approximately 550° C., more preferably, at a temperature ranging from approximately 550° C. to approximately 750° C., in semiconductor manufacturing processes, such as 3D NAND manufacturing process. Disclosed are precursors and processes for deposition of Si-containing films using ALD process at a temperature of approximately 550° C. or higher without parasitic CVD reactions. Also disclosed are precursors and processes for deposition of Si-containing films using ALD process at a temperature of approximately 550° C. or higher for manufacturing conformal silicon-containing layers in 3D NAND. Examples of the silicon-containing films may be $Si_aO_bC_cN_d$, where a>0; b, c, d≥0. The silicon-containing films may contain H, which may be in a low concentration, for example, from approximately 0% by weight or w/w to approximately 5% w/w. The Si-containing films may be silicon oxide films or silicon nitride films.

The disclosed precursors for deposition of Si-containing films using ALD process at a temperature higher than approximately 500° C. have the following formula:

$$SiR^1_y R^2_{4-x-y}(NH\text{—}SiR'_3)_x \quad (I),$$

wherein x=2, 3, 4; y=0, 1, 2, $R^1$ and $R^2$ each are independently selected from H, a halogen (Cl, Br, I), an $C_1$-$C_4$ alkyl, an isocyanate, a $C_1$-$C_4$ alkoxide, or an —$NR^3R^4$ group in which $R^3$ and $R^4$ each are independently selected from H, a $C_1$-$C_4$ alkyl, provided that if $R^3$=H, $R^4$>$C_1$; each R' is independently selected from H, a halogen (Cl, Br, I), or a $C_1$-$C_4$alkyl. Preferably, in the formula (I), when x=2 and y=1, then $R^1$=$R^2$=H, $R^1$=Cl and $R^2$=H, or $R^1$=Cl and $R^2$=Cl, R'=$CH_3$; and when x=3 and y=1, then $R^1$=H or Cl, R'=$CH_3$; and when x=2, 3, 4 and y=1, 2, R'=H or Cl (x=4), R'=$CH_3$.

When x=2, y=1; $R^1$=$R^2$=H; R'=$CH_3$ in formula (I), exemplary disclosed Si-containing precursors include $SiH_2$(NH—Si($CH_3$)$_3$)$_2$.

When x=2, y=1; $R^1$=Cl; $R^2$=H; R'=$CH_3$ in formula (I), exemplary disclosed Si-containing precursors include SiHCl(NH—Si($CH_3$)$_3$)$_2$.

When x=2, y=1; $R^1$=Cl; $R^2$=Cl, R'=$CH_3$ in formula (I), exemplary disclosed Si-containing precursors include $SiCl_2$(NH—Si($CH_3$)$_3$)$_2$.

When x=3, y=1; R'=H or Cl; R'=$CH_3$ in formula (I), exemplary disclosed Si-containing precursors include SiH(NH—Si($CH_3$)$_3$)$_3$ or SiCl(NH—Si($CH_3$)$_3$)$_3$.

When x=2, 3, y=0, 1; x=4, y=0; $R^1$=H or Cl (x=4), R'=$CH_3$ in formula (I), the exemplary disclosed Si-containing precursors are $SiH_2$(NH—Si($CH_3$)$_3$)$_2$, $SiCl_2$(NH—Si($CH_3$)$_3$)$_2$, SiHCl(NH—Si($CH_3$)$_3$)$_2$, SiH(NH—Si($CH_3$)$_3$)$_3$, SiCl(NH—Si($CH_3$)$_3$)$_3$, and Si(NH—Si($CH_3$)$_3$)$_4$.

The disclosed Si-containing precursors may be $SiH_2$(NH—Si($CH_3$)$_3$)$_2$, SiHCl(NH—Si($CH_3$)$_3$)$_2$, $SiCl_2$(NH—Si($CH_3$)$_3$)$_2$, SiH(NH—Si($CH_3$)$_3$)$_3$, SiCl(NH—Si($CH_3$)$_3$)$_3$, or Si(NH—Si($CH_3$)$_3$)$_4$. The disclosed Si-containing precursors may be $H_2$Si(NH—$SiMe_3$)$_2$. The disclosed Si-containing precursors may be HSi(NH—$SiMe_3$)$_3$. The disclosed Si-containing precursors may be Si(NH—$SiMe_3$)$_4$.

The following disclosed Si-containing precursors may be synthesized according to the synthesis methods disclosed in *J. Organometallic Chemistry*, 287 (1985) p305-320 to Baruer et al. and their structure formula, CAS numbers and boiling points are included in Table 1. One of ordinary skill in the art will recognize that the synthesis methods for these compounds may be obtained using the CAS numbers provided.

TABLE 1

Commercially available Si-containing precursors

| Precursors | Formula | Structure | CAS Number |
|---|---|---|---|
| bis(trimethylsilylamino)silane (2TMSAS) | $H_2Si(NH\text{—}SiMe_3)_2$ |  | 153823-59-7 |
| tris(trimethylsilylamino)silane (3TMSAS) | $HSi(NH\text{—}SiMe_3)_3$ | | 123717-14-6 |

TABLE 1-continued

Commercially available Si-containing precursors

| Precursors | Formula | Structure | CAS Number |
|---|---|---|---|
| tetrakis(trimethylsilylamino)silane (4TMSAS) | Si(NH—SiMe$_3$)$_4$ |  | 62277-66-1 |

The disclosed may be a composition for deposition of a film comprising a Si-containing precursor having the formula:

$$SiR^1_y R^2_{4-x-y}(NH-SiR'_3)_x \quad (II)$$

wherein x=2, 3, 4; y=0, 1, 2, $R^1$ and $R^2$ each are independently selected from H, a halogen (Cl, Br, I), an $C_1$-$C_4$ alkyl, an isocyanate, a $C_1$-$C_4$ alkoxide, or an —NR$^3$R$^4$ group in which $R^3$ and $R^4$ each are independently selected from H, a $C_1$-$C_4$ alkyl, provided that if $R^3$=H, $R^4$>$C_1$; each R' is independently selected from H, a halogen (Cl, Br, I), or a $C_1$-$C_4$ alkyl, provided that if x=2 and y=1, $R^1$=H, $R^2$≠H or $R^2$=H, $R^1$≠H; or if x=3 and y=1, $R^1$≠H.

The disclosed composition may be the Si-containing precursor is selected from SiH$_2$(NH—Si(CH$_3$)$_3$)$_2$, SiHCl(NH—Si(CH$_3$)$_3$)$_2$, SiCl$_2$(NH—Si(CH$_3$)$_3$)$_2$, SiH(NH—Si(CH$_3$)$_3$)$_3$, SiCl(NH—Si(CH$_3$)$_3$)$_3$, or Si(NH—Si(CH$_3$)$_3$)$_4$.

The disclosed Si-containing precursors contain at least two Si—NH—Si groups. Preferably, the disclosed Si-containing precursors contain two, three or four Si—NH—Si groups.

Preferably, the disclosed Si-containing precursors have suitable properties for vapor deposition methods, such as vapor pressure ranging from approximately 0.1 Torr at 23° C. to approximately 1,000 Torr at 23° C., a melting point below 20° C. (preferably being in liquid form at room temperature) and more preferably below –20° C. to prevent freeze/thaw issues, and exhibiting 0% by volume or v/v to 1% v/v decomposition per week at the temperature required to obtain a usable vapor pressure (1-100 Torr).

The disclosed Si-containing precursors may be suitable for the deposition of Si-containing films, such as, SiO$_2$ and SiN, by ALD processes and may have the following advantages:
a. liquid at room temperature or having a melting point lower than 50° C.;
b. thermally stable to enable proper distribution and evaporation using industry standard methods (bubbler, direct liquid injection, vapor draw) without particle generation and product decomposition;
c. suitable reactivity with the substrate to permit a wide self-limited ALD window, allowing deposition of a variety of Si-containing films, such as SiO$_2$, SiN, or SiCN, etc.;
d. Suitable reactivity of the chemisorbed precursor with a co-reactant to form a Si-containing film in an ALD process; and
e. High thermal stability of the chemisorbed species to prevent self-decomposition and parasitic CVD growth on the surface.

Mile the disclosed Si-containing precursors are ideally liquids and vaporized in bubblers or direct liquid injection systems, the use of solid precursors for ALD precursor vaporization is also possible using sublimators such as ones disclosed in PCT Publication WO2009/087609 to Xu et al. Alternatively, solid precursors may be mixed or dissolved in a solvent to reach a usable melting point and viscosity for usage by Direct Liquid Injection systems.

To ensure process reliability, the disclosed Si-containing precursors may be purified by continuous or fractional batch distillation or sublimation prior to use to a purity ranging from approximately 93% by weight or w/w to approximately 100% w/w, preferably ranging from approximately 99% w/w to approximately 99.999% w/w, more preferably, ranging from approximately 99% w/w to approximately 100% w/w.

The disclosed Si-containing precursors may contain any of the following impurities: undesired congeneric species; solvents; chlorinated metal compounds; or other reaction products. In one alternative, the total quantity of these impurities is below 0.1% w/w.

Solvents, such as hexane, pentane, dimethyl ether, or anisole, may be used in the precursor's synthesis. The concentration of the solvent in the disclosed Si-containing precursors may range from approximately 0% w/w to approximately 5% w/w, preferably from approximately 0% w/w to approximately 0.1% w/w. Separation of the solvents from the precursor may be difficult if both have similar boiling points. Cooling the mixture may produce solid precursor in liquid solvent, which may be separated by filtration. Vacuum distillation may also be used, provided the precursor product is not heated above approximately its decomposition point.

In one alternative, the disclosed Si-containing precursors contain less than 5% v/v, preferably less than 1% v/v, more preferably less than 0.1% v/v, and even more preferably less than 0.01% v/v of any of its undesired congeneric species, reactants, or other reaction products. This alternative may provide better process repeatability. This alternative may be produced by distillation of the disclosed Si-containing precursors.

In another alternative, the disclosed Si-containing precursors may contain between 5% v/v and 50% v/v of one or more of congeneric Si-containing precursors, reactants, or other reaction products, particularly when the mixture provides improved process parameters or isolation of the target compound is too difficult or expensive. For example, a mixture of two Si-containing precursors may produce a stable, liquid mixture suitable for vapor deposition.

The concentration of trace metals and metalloids in the disclosed Si-containing precursors each may range from approximately 0 ppb to approximately 100 ppb, and more preferably from approximately 0 ppb to approximately 10 ppb.

Also disclosed are methods or processes for forming Si-containing layers on a substrate using an ALD process in a reaction chamber. In one embodiment, the method for forming a Si-containing film on a substrate comprises the steps of heating the substrate in a reactor to a temperature of 550° C. or higher, exposing the substrate to a vapor including a Si-film forming composition that contains a Si-containing precursor having the formula:

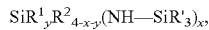
$$SiR^1{}_yR^2{}_{4-x-y}(NH-SiR'_3)_x,$$

wherein x=2, 3, 4; y=0, 1, 2, $R^1$ and $R^2$ each are independently selected from H, a halogen (Cl, Br, I), an $C_1$-$C_4$ alkyl, an isocyanate, a $C_1$-$C_4$ alkoxide, or an —$NR^3R^4$ group in which $R^3$ and $R^4$ each are independently selected from H, a $C_1$-$C_4$ alkyl, provided that if $R^3$=H, $R^4$>$C_1$; each R' is independently selected from H, a halogen (Cl, Br, I), or a $C_1$-$C_4$ alkyl, and depositing at least part of the Si-containing precursor onto the substrate to form the Si-containing film on the substrate through an ALD process. The method further comprises the step of exposing the substrate to a co-reactant, wherein the co-reactant is selected from $O_3$, $O_2$, $H_2O$, NO, $N_2O$, $NO_2$, $H_2O_2$, O radicals, $NH_3$, hydrazines, $N_2$ plasma, $N_2/H_2$ plasma, $NH_3$ plasma, amines and combinations thereof. In another embodiment, the method for forming a Si-containing film on a substrate comprises the steps of heating a substrate in a reactor to a temperature of higher than 550° C., and forming a chemisorbed and/or physisorbed film, on the surface of the substrate, of a Si-containing precursor having the formula:

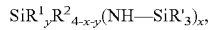
$$SiR^1{}_yR^2{}_{4-x-y}(NH-SiR'_3)_x,$$

wherein x=2, 3, 4; y=0, 1, 2, $R^1$ and $R^2$ each are independently selected from H, a halogen (Cl, Br, I), an $C_1$-$C_4$ alkyl, an isocyanate, a $C_1$-$C_4$ alkoxide, or an —$NR^3R^4$ group in which $R^3$ and $R^4$ each are independently selected from H, a $C_1$-$C_4$ alkyl, provided that if $R^3$=H, $R^4$>$C_1$; each R' is independently selected from H, a halogen (Cl, Br, I), or a $C_1$-$C_4$ alkyl. The method further comprises the step of chemically reacting the chemisorbed and/or physisorbed film comprising the Si-containing precursor with a co-reactant, wherein the co-reactant reacting with the Si-containing precursor in the chemisorbed and/or physisorbed film produces a reaction product that forms a second film on the surface of the substrate. The methods may be useful in the manufacture of semiconductor, photovoltaic, LCD-TFT, flat panel type or flash memory devices. The disclosed Si-containing precursors may be used to deposit thin Si-containing films using ALD methods known to those of skill in the art.

The disclosed processes using the disclosed Si-containing precursors comprise ALD processes for deposition of Si-containing films. Suitable ALD methods include thermal ALD, spatial ALD and temporal ALD methods. Preferably the suitable ALD methods do not use a plasma, as it is extremely difficult to grow conformal films in high aspect ratio with this type of ALDs. It is understood that the suitable ALDs may operate in a non-perfect self-limited growth regime, allowing some parasitic CVD to happen. Such parasitic CVD may not be a problem as long as the deposited film meets conformity requirements.

The reaction chamber may be any enclosure or chamber of a device in which deposition methods take place, such as, without limitation, a parallel-plate type reactor, a hot-wall type reactor, a single-wafer reactor, a multi-wafer reactor, or other such types of deposition systems. All of these exemplary reaction chambers are capable of serving as an ALD reaction chamber.

The reactor contains one or more substrates onto which the thin films will be deposited. A substrate is generally defined as the material on which a process is conducted. The substrates may be any suitable substrate used in semiconductor, photovoltaic, flat panel, or LCD-TFT device manufacturing. Examples of suitable substrates include wafers, such as silicon, SiGe, silica, glass, or Ge. The substrate may also have one or more layers of differing materials already deposited upon it from a previous manufacturing step. For example, the wafers may include silicon layers (crystalline, amorphous, porous, etc.), silicon oxide layers, silicon nitride layers, silicon oxy nitride layers, carbon doped silicon oxide (SiCOH) layers, or combinations thereof. Additionally, the wafers may include copper, cobalt, ruthenium, tungsten and/or other metal layers (e.g. platinum, palladium, nickel, ruthenium, or gold). The wafers may include barrier layers or electrodes, such as tantalum, tantalum nitride, etc. The layers may be planar or patterned. The substrate may be an organic patterned photoresist film. The substrate may include layers of oxides which are used as dielectric materials in 3D NAND, MIM, DRAM, or FeRam technologies (for example, $ZrO_2$ based materials, $HfO_2$ based materials, $TiO_2$ based materials, rare earth oxide based materials, ternary oxide based materials, etc.) or from nitride-based films (for example, TaN, TiN, NbN) that are used as electrodes. The disclosed processes may deposit the Si-containing layer directly on the wafer or directly on one or more than one (when patterned layers form the substrate) of the layers on top of the wafer. Furthermore, one of ordinary skill in the art will recognize that the terms "film" or "layer" used herein refer to a thickness of some material laid on or spread over a surface and that the surface may be a trench or a line. Throughout the specification and claims, the wafer and any associated layers thereon are referred to as substrates. The actual substrate utilized may also depend upon the specific precursor embodiment utilized.

The disclosed ALD processes using the disclosed Si-containing precursors may be performed for substrates having a temperature of approximately 200° C. or higher, preferably approximately 550° C. or higher. The disclosed ALD processes using the disclosed Si-containing precursors may be performed for substrates having a temperature range from greater than 550° C. to approximately 750° C., more preferably from greater than 550° C. to approximately 700° C., or from greater than 550° C. to approximately 650° C.

The substrate exposure time in the disclosed ALD processes using the disclosed precursors may range from 1 millisecond to 5 minutes, preferably from 1 second to 60 seconds. The co-reactant exposure time in the disclosed ALD processes using the disclosed precursors may range from 1 millisecond to 1 minute, preferably from 100 milliseconds to 30 seconds.

The disclosed processes may be a thermal ALD of $SiO_2$ film or a thermal ALD of SiN film.

The pressure within the reaction chamber are held at conditions suitable for the precursor to react with the surface. For instance, the pressure in the chamber may be held between approximately 0.1 mTorr and approximately 1000 Torr, preferably between approximately 0.1 Torr and approximately 400 Torr, more preferably between approximately 1 Torr and approximately 100 Torr, even more preferably between approximately 1 Torr and approximately 10 Torr.

The temperature of the reactor chamber may be controlled by either controlling the temperature of the substrate holder or controlling the temperature of the reactor wall. Devices used to heat the substrate are known in the art. The reactor wall is heated to a sufficient temperature to obtain the desired film at a sufficient growth rate and with desired physical state and composition. A non-limiting exemplary temperature range to which the reactor wall may be heated includes from approximately 200° C. to approximately 1000° C., Preferably from approximately 400° C. to approximately 800° C. Alternatively a non-limiting exemplary temperature to which the reactor wall may be heated includes approximately 550° C. or higher. When a thermal process is performed, the deposition temperature may range from approximately 400° C. to approximately 800° C., preferably from approximately 550° C. to approximately 750° C., more preferably from greater than 550° C. to approximately 700° C., or from greater than 550° C. to approximately 650° C.

In addition to the disclosed Si-containing precursors, a reactant or a co-reactant may also be exposed to the substrate. The co-reactant may be an oxygen-containing gas for $SiO_2$ film deposition. The oxygen-containing gas includes, but is not limited to, oxidizers such as, $O_3$, $O_2$, $H_2O$, NO, $N_2O$, $NO_2$, $H_2O_2$, O radicals & combinations thereof, preferably $O_3$ or $O_2$. Typically, $O_3/O_2$ mixtures are used for high temperature (e.g., approximately 550° C. or higher) oxide deposition. The silicon oxide film formed at high temperature (e.g., approximately 550° C. or higher) may be used in fabrication of flash memory devices and may be part of a flash memory device.

The ALD sequence may include sequential pulses of several compounds. For instance, the surface may be exposed to $O_2/O_3$ followed by $H_2O$ in order to increase the density of hydroxyl groups on the surface. The co-reactant may be activated by a plasma, either in-situ or remotely. Applicants discovered that $O_2$ may be an adequate co-reactant without $O_3$ when the substrate temperature is higher than 550° C.

Alternatively, the co-reactant may be a nitrogen-containing gas for SiN or SiON deposition. The nitrogen-containing gas includes, but is not limited to, $NH_3$, NO, $N_2O$, hydrazines, primary amines such as methylamine, ethylamine, tertbutylamine; secondary amines such as dimethylamine, diethylamine, di-isoprpylamine, ethylmethylamine, pyrrolidine; tertiary amines such as trimethylamine, triethylamine, trisilylamine, $N_2$, $N_2/H_2$, mixture thereof, preferably $NH_3$. The co-reactant may be activated by a plasma, either in-situ or remotely. For $N_2$ or $N_2/H_2$, the plasma activation is required. The co-reactant may be selected from $NH_3$, NO, $N_2O$, hydrazines, $N_2$ plasma, $N_2/H_2$ plasma, $NH_3$ plasma, amines and combinations thereof.

For deposition of silicon oxynitride films, one or a combination of the above co-reactants may be used, either by co-flowing the reactant, or sequentially.

The disclosed ALD process or sequence typically includes a step to remove excess co-reactant from the deposition surface by providing a purge step, either by purging a reactor with an inert gas, or passing the substrate in a sector under high vacuum and/or a carrier gas curtain.

The disclosed Si-containing precursors and the co-reactants may be introduced into the reactor or exposed to the substrate sequentially (ALD). The reactor may be purged with an inert gas between the introduction or exposure of the precursor and the introduction or exposure of the co-reactant. Alternatively, the substrate can be moved from one area for precursor exposure to another area for co-reactant exposure (Spatial ALD).

Depending on the particular process parameters, deposition may take place for a varying length of time. Generally, deposition may be allowed to continue as long as desired or necessary to produce a film with the necessary thickness. Typical film thicknesses may vary from an atomic monolayer to several hundreds of microns, depending on the specific deposition process, preferably between 0.5 and 100 nm, more preferably between 1 and 50 nm. The deposition process may also be performed as many times as necessary to obtain the desired film.

In one non-limiting exemplary ALD type process, the vapor phase of the disclosed Si-containing precursor is introduced into the reactor or exposed to the substrate, where the Si-containing precursor physi- or chemisorbs on the substrate. Excess composition may then be removed from the reactor by purging and/or evacuating the reactor. A desired gas (for example, $O_3$) is introduced into the reactor or exposed to the substrate where it reacts with the physi- or chemisorbed precursor in a self-limiting manner. Any excess reducing gas is removed from the reactor by purging and/or evacuating the reactor. If the desired film is a Si-containing film, this two-step process may provide the desired film thickness or may be repeated until a film having the necessary thickness has been obtained.

The disclosed thermal ALD processes using the disclosed Si-containing precursors with $O_2$ or $O_3$ oxidizer as co-reactant are able to deposit high-quality $SiO_2$ film having the property of WER less than 4 (normalized to thermally grown $SiO_2$) from the examples that follow.

EXAMPLES

The following non-limiting examples are provided to further illustrate embodiments of the invention. However, the examples are not intended to be all inclusive and are not intended to limit the scope of the inventions described herein.

In the following examples, all wafers used herein are bare Si wafers and/or trench wafers. Before deposition, the bare Si wafers were treated with 1% HF aq for 2 min and then rinsed with DI $H_2O$. A coupon size of the trench wafers is 30 mm×20 mm and a trench size of the trench wafer is 250 nm×6 um. The aspect ratio (AR) for the trench wafers is larger than 10:1, preferably, larger than 24:1. The substrate used herein is a wafer with patterns.

Comparative Example 1. Pyrolysis Test of BTBAS in the Gas Phase

Pyrolysis is a self-thermal-decomposition test of a chemical at elevated temperatures. At pyrolysis temperature, the chemical starts to decompose without any co-reactant. Regarding ALD of a film, if the temperature is higher than the pyrolysis temperature, the precursor will decompose and the ALD process will mix with a CVD process due to precursor thermal decomposition. For genuine ALD, the precursor is only applicable below its pyrolysis temperature in order to prevent parasitic CVD reactions.

BTBAS is bis(tert-butylamino)silane (CAS No.: 186598-40-3),

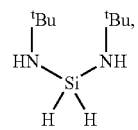

a liquid chemical precursor having been used for ALD and/or CVD of silicon nitride, silicon oxynitride and silicon dioxide films at a temperature below 500° C. or 600° C. BTBAS contains Si—NH—C group bridging Si and t-Bu, which is not the same as the disclosed Si-containing precursors having Si—NH—Si group bridging two Si atoms. From the examples that follow, it is seen that the disclosed Si-containing precursors have unexpected results compared to BTBAS.

The conditions for pyrolysis test of BTBAS are as follows. The flow rate of BTBAS was 2 sccm; the process bubble flow rate was 35 sccm; the carrier gas $N_2$ flow rate was 40 sccm; the process time was 60 mins; the process pressure was 5 Torr and the substrate temperature varied from 500 to 650° C. with a 50° C. difference (i.e., 500° C., 550° C., 600° C. and 650° C.). The deposition film thickness was measured using Ellipsometry. The deposition film thickness at the temperature 500° C. is 0 nm. The deposition film thickness at the temperature 550° C. is 4.4 nm. The deposition film thickness at the temperature 600° C. is 40 nm. The deposition film thickness at the temperature 650° C. is 160 nm.

Pyrolysis test of BTBAS in the gas phase is shown in FIG. 1. As shown, a slight pyrolysis occurs from 550° C., meaning BTBAS precursor is not suitable for ALD at a temperature higher than 550° C.

Example 1. Synthesis and Properties of 2TMSAS

Figure 2A:
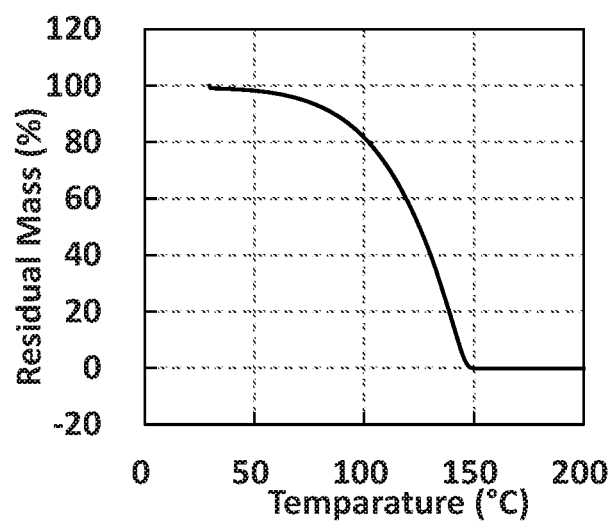
FIG. 2a is a thermogravimetric analysis (TGA) graph demonstrating the percentage of weight loss with increasing temperature of 2TMSAS.
Figure 2B:
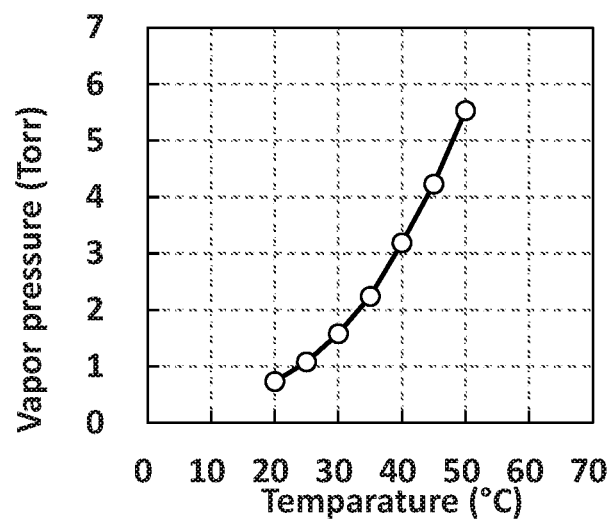
FIG. 2b is a vapor pressure graph of 2TMSAS.

2TMSAS was synthesized by the following steps. A vacuumed at 10 mTorr dried 3-headed 1 L flask equipped with magnetic stirrer and thermometer was cooled in a −70° C. bath. To this flask, 160 g 1,1,1,3,3,3,hexamethyldisilazane (HMDS) was charged. The HMDS was cooled to <−20° C., then dichlorosilane (DCS) gas was introduced by mass flow controller (MFC) at 50 sccm by total 25 gram. Then the reaction was maintained under vacuum, stirred and warmed to room temperature for 6 hr. The resulted crude products then were filtered. After that, chlorotrimethylsilane (TMSCI) and excess HMDS were removed by vacuum. The remaining solution was vacuum distilled. The product $H_2Si(NH—SiMe_3)_2$ was recovered at 60-65° C. at 60 mtorr with a yield of 45%. The TGA of the synthesized $H_2Si(NH—SiMe_3)_2$ is shown in FIG. 2a. The TGA graph shows clean evaporation with a low (<0.01%) remaining residue at approximately 150° C. In addition, after TGA, no material remained in the TG pan. FIG. 2b is a vapor pressure graph of 2TMSAS. The temperature at 1 Torr is approximately 24° C. and at 5 Torr is approximately 48° C.

Example 2. Synthesis and Properties of 3TMSAS

3TMSAS was synthesized by the following steps. A dried 3-headed 1 L flask equipped with magnetic stirrer, thermometer and dropping funnel was charged with 600 g 1,1,1,3,3,3,hexamethyldisilazane (HMDS) and cooled in ice/water bath under $N_2$ blanket. 100 g $SiHCl_3$ was dropped into the HMDS solution with the temperature maintained below 10° C. The solution was slowly warmed up to room temperature during a twelve-hour overnight period. Then the solution was moved from the water bath to an oil bath to heat the solution with refluxing for 20 hrs. After that, chlorotrimethylsilane (TMSCI) and excess HMDS was removed by vacuum. The product was distilled under vacuum and the product was recovered at 85-90° C. at 60 mTorr with a yield of 60%. The molecular weight is 292 g/mol.

Figure 3A:
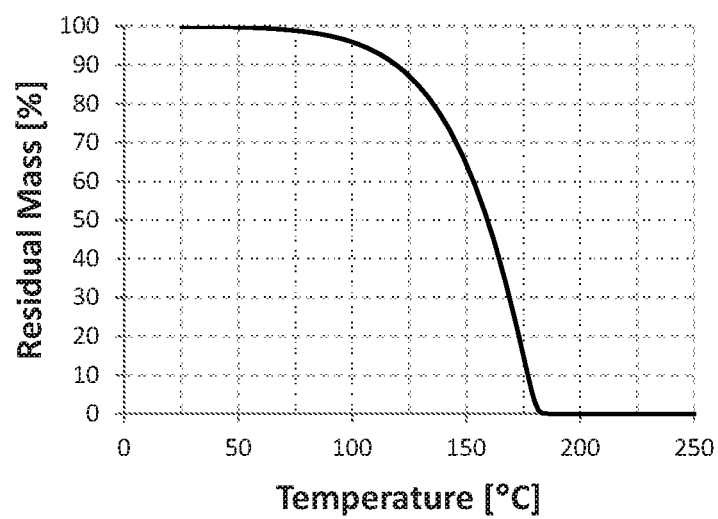
FIG. 3a is a thermogravimetric analysis (TGA) graph demonstrating the percentage of weight loss with increasing temperature of 3TMSAS.

The TGA of the synthesized 3TMSAS is shown in FIG. 3a. The TGA graph shows clean evaporation with a low (<0.01%) remaining residue at 185° C. In addition, after TGA, no material remained in the TG pan.

Figure 3B:
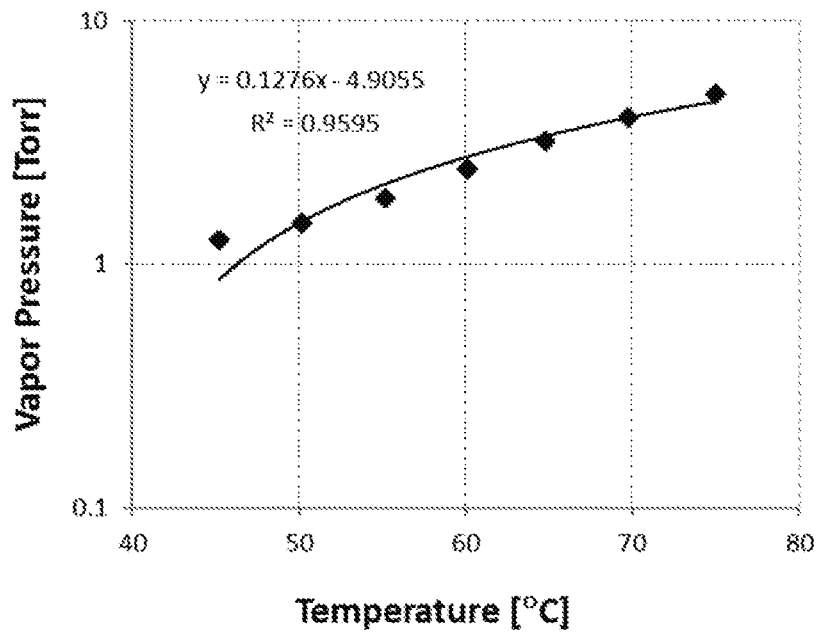
FIG. 3b is a vapor pressure graph of 3TMSAS.

The vapor pressure of the synthesized 3TMSAS is shown in FIG. 3b. The temperature at 1 Torr is 46° C. and at 5 Torr is 78° C.

Example 3. Pyrolysis Test of 2TMSAS in the Gas Phase

The conditions for pyrolysis test of 2TMSAS are as follows. The flow rate of the sample 2TMSAS was 2 sccm; the process bubble flow rate was 35 sccm; the carrier gas $N_2$ flow rate was 40 sccm; the process time was 60 mins; the process pressure was 5 Torr and the substrate temperature varied from 600 to 750° C. with a 50° C. difference (i.e., 600° C., 650° C., 700° C. and 750° C.). The deposition film thickness was measured using Ellipsometry. No visible deposited films were observed at the temperatures of 600 and 650° C.; the deposition film thickness at the temperature 700° C. was around 31 nm; the deposition film thickness at the temperature 750° C. was around 107 nm.

Figure 4:
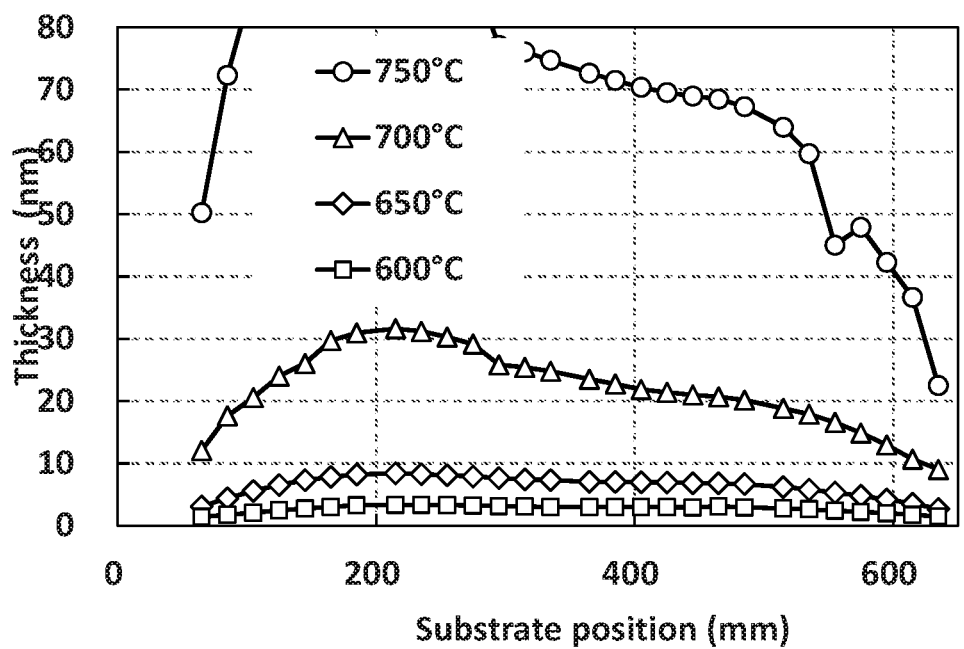
FIG. 4 is a self-decomposition curve of 2TMSAS in the gas phase (pyrolysis test)

Pyrolysis test of 2TMSAS in the gas phase is shown in FIG. 4. As shown, a slight film formation was observed after a 2 hour pyrolysis test starting at 650° C. 2TMSAS started a slight pyrolysis deposition from 600° C. (pyrolysis temperature) which is 50° C. higher than BTBAS. This means the ALD temperature window of 2TMSAS may be 50° C. higher than BTBAS. Here, the pyrolysis deposition is a CVD process. Thus, a pure ALD may not be obtained over the pyrolysis temperature due to the CVD behavior of pyrolysis deposition. The ALD may be possible at the pyrolysis starting temperature, because the precursor pulse duration in an ALD cycle is much shorter than pyrolysis experiment, (for example 30 sec vs 60 min). Thus, the amount of pyrolysis deposition during an ALD process may be negligible.

Comparing the pyrolysis temperature of 2TMSAS to that of BTBAS, the pyrolysis temperature of 2TMSAS is approximately 600° C., which is 50° C. higher than that of BTBAS at 550° C. Thus, 2TMSAS is a precursor suitable for high-temperature oxidation (HTO) ALD processes above 550° C. where BTBAS is no longer suitable. In addition, the parasitic CVD rate at 650° C. may be sufficiently low that 2TMSAS may be useable in some ALD applications up to 650° C. if said ALD applications can tolerate this level of thermal CVD contributing to the final film.

Example 4. Pyrolysis Test of 3TMSAS in the Gas Phase

The conditions for pyrolysis test of 3TMSAS are as follows. The flow rate of the sample 3TMSAS was 2 sccm; the process bubble flow rate was 35 sccm; the carrier gas $N_2$ flow rate was 40 sccm; the process time was 60 mins; the process pressure was 5 Torr and the substrate temperature varied from 600 to 750° C. with a 50° C. difference (i.e., 600° C., 650° C., 700° C. and 750° C.). The deposition film thickness was measured using Ellipsometry. The deposition film thickness at the temperature 600 and 650° C. are 0 nm; the deposition film thickness at the temperature 700° C. is 1.2 nm; the deposition film thickness at the temperature 750° C. is 10.1 nm.

Figure 5:
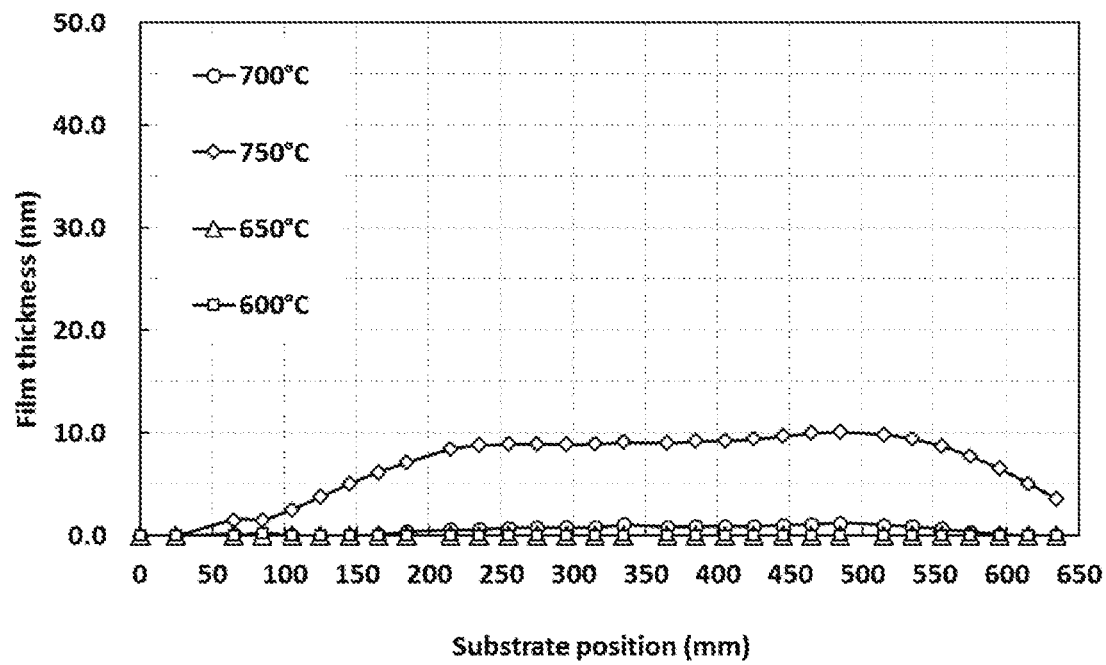
FIG. 5 is a self-decomposition curve of 3TMSAS in the gas phase (pyrolysis test)

Pyrolysis test of 3TMSAS in the gas phase is shown in FIG. 5. As shown, a slight film formation was observed after 1 hour pyrolysis test from 700° C. 3TMSAS started a slight pyrolysis deposition from 700° C. (pyrolysis temperature) which is 150° C. higher than BTBAS. This means the ALD temperature window of 3TMSAS may be 150° C. higher than BTBAS. Here, the pyrolysis deposition is a CVD process. Thus, a pure ALD may not be obtained over the pyrolysis temperature due to the CVD behavior of pyrolysis deposition. The ALD may be possible at the pyrolysis starting temperature, because the precursor pulse duration in an ALD cycle is much shorter than pyrolysis experiment, (for example 30 sec vs 60 min). Thus, the amount of pyrolysis deposition during an ALD process may be negligible.

Comparing the pyrolysis temperature of 3TMSAS to that of BTBAS, the pyrolysis temperature of 3TMSAS is approximately 700° C., which is 150° C. higher than that of BTBAS at 550° C. Thus, 3TMSAS is a precursor suitable for high-temperature oxidation (HTO) ALD processes above 550° C. where BTBAS is no longer suitable.

Example 5. ALD Using 2TMSAS with $O_3$ at 650° C., 600° C. and 500° C.

The conditions for ALD using 2TMSAS with $O_3$ at 650° C., 600° C. and 500° C. are as follows. The pulse/purge for 2TMSAS was 10 s/60 s; the flow rate of the sample 2TMSAS was 2 sccm; the process bubble flow rate was 35 sccm; the process pressure was 5 Torr; the number of ALD cycles was 200; the pulse/purge for $O_3$ was 15 s/30 s; the flow rate of $O_3$ was 100 sccm; the wafer was cleaned with 1% HF aq. The deposition film thickness was measured using Ellipsometry, which are 47 nm, 41 nm and 18 nm, respectively, for 650° C., 600° C. and 500° C.

Figure 6:
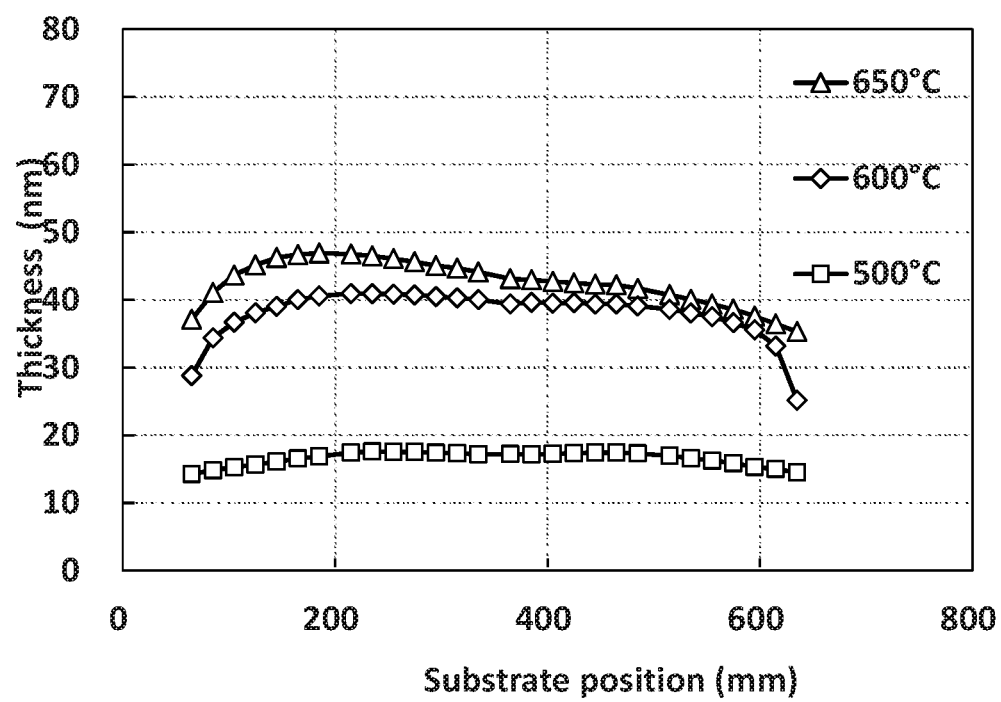
FIG. 6 is a graph of ALD film thickness (nm) versus deposition position (mm) on the wafer for 2TMSAS with $O_3$ at 600° C., 650° C. and 500° C.

FIG. 6 is a graph of ALD film thickness (nm) versus deposition position (mm) on the wafer for 2TMSAS with $O_3$ at 650° C., 600° C. and 500° C. 2TMSAS with co-reactant $O_3$ at 650° C. provides a thicker film than 2TMSAS with co-reactant $O_3$ at 600° C., and 2TMSAS with co-reactant $O_3$ at 600° C. provides a flatter film than that at 650° C., meaning at 600° C. 2TMSAS provides almost uniform film thickness. Comparing to the film formed at 500° C., 2TMSAS with co-reactant $O_3$ provides a thicker film at 600° C. and 650° C. than 2TMSAS with co-reactant $O_3$ at 500° C. Furthermore, the film formed at 500° C. is very flat, meaning at 500° C. 2TMSAS provides uniform film thickness. Thus, $O_3$ may be used as a co-reactant in high temperature ALD.

Example 6. ALD of 3TMSAS with Co-Reactant $O_2$ at 650° C.

650° C. is the temperature that no pyrolysis occurs with 3TMSAS as shown in FIG. 5. The conditions for ALD of 3TMSAS with $O_2$ at 650° C. are as follows. The pulse/purge for 3TMSAS was 10 s/60 s; the flow rate of the sample 3TMSAS was 2 sccm; the process bubble flow rate was 35 sccm; the process pressure was 5 Torr; the number of ALD cycles was 200; the pulse/purge for $O_2$ was 15 s/30 s; the flow rate of $O_2$ was 100 sccm; the wafer was cleaned with 1% HF aq. The deposition film thickness was measured using Ellipsometry.

Figure 7:
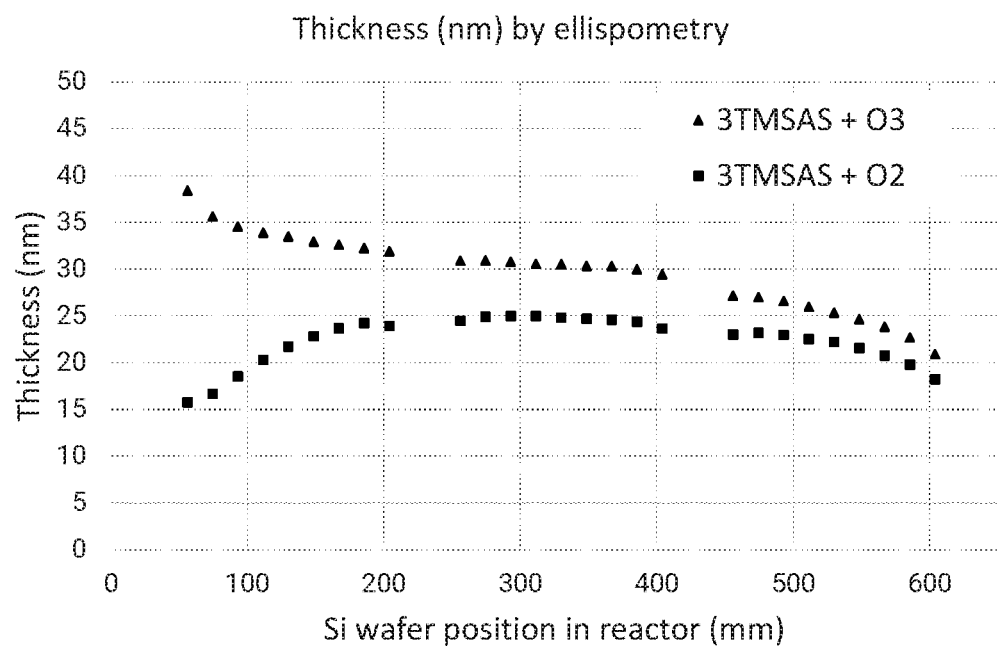
FIG. 7 is a graph of ALD thickness (nm) versus deposition position (mm) on the wafer for 3TMSAS with $O_2$ and $O_3$ co-reactants at 650° C.

FIG. 7 is a graph of ALD thickness (nm) versus deposition position (mm) on the wafer for 3TMSAS with $O_2$ and $O_3$ at 650° C. 3TMSAS with co-reactant $O_3$ provides a thicker film than 3TMSAS with co-reactant 02. Ozone offered a thicker profile than 02. WER with $O_2$ is below 7 (around 6.50) a little higher than that with $O_3$ (4). Thus, 02 may be used as a co-reactant in high temperature ALD.

Example 7. FTIR and XPS: ALD of $SiO_2$ Using 3TMSAS Versus BTBAS

Figure 8:
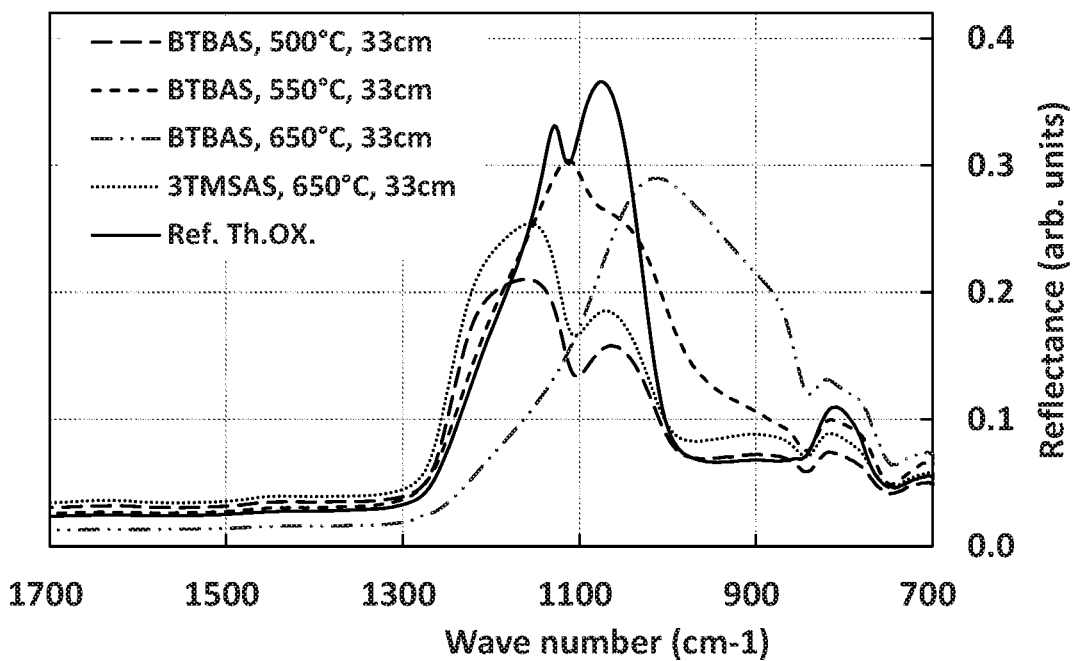
FIG. 8 is FTIR comparison between 3TMSAS versus BTBAS.
Figure 9:
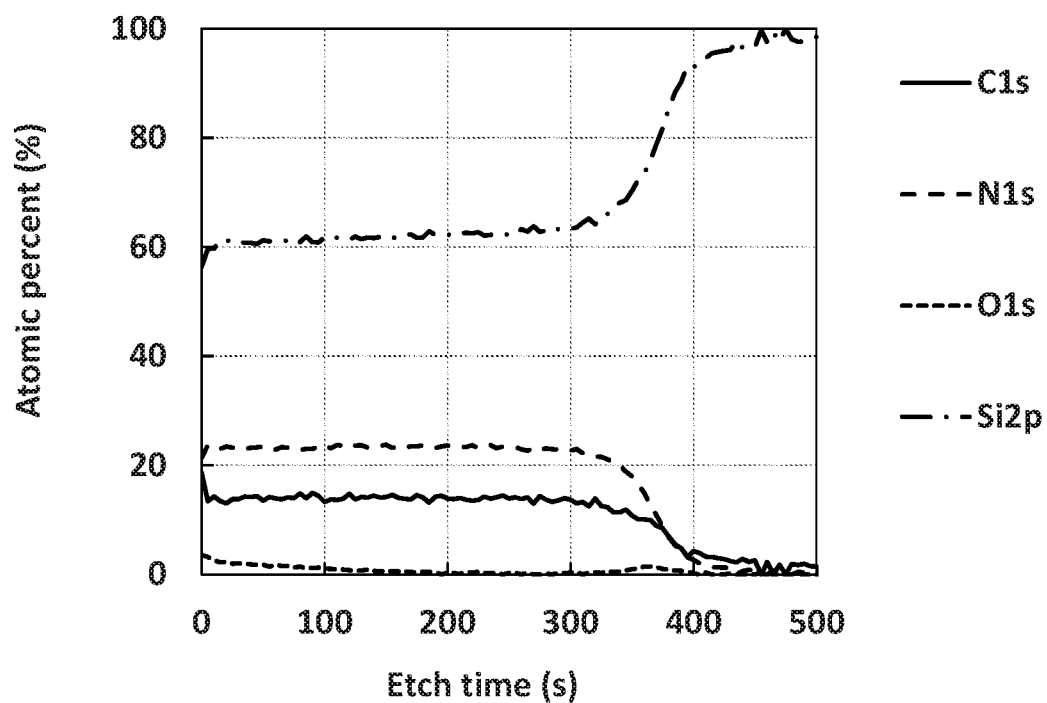
FIG. 9 is XPS results after pyrolysis BTBAS at 600° C.
Figure 10:
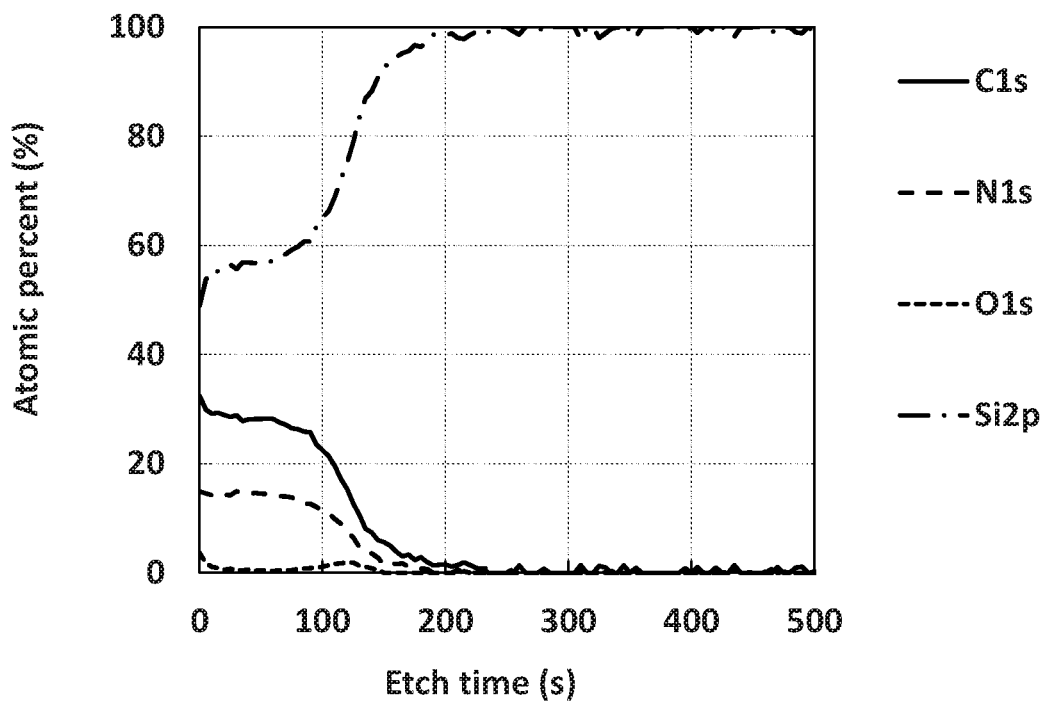
FIG. 10 is XPS results after pyrolysis 3TMSAS at 750° C.

It is known that BTBAS at a temperature below 550° C. produces ALD of $SiO_2$ but at a temperature higher than 550° C. leads to SiOCN formation that is due to parasitic CVD. The FTIR peak of BTBAS at a temperature higher than 550° C. after ALD of $SiO_2$, as shown in FIG. 8, shifts comparing to the FTIR peak at 500° C., indicating compositions of the deposited film changes. As shown in FIG. 9, after pyrolysis of BTBAS at 600° C., BTBAS does decompose to Si, N, C and O. FIG. 8 shows that the 3TMSAS FTIR at 650° C. and the BTBAS FTIR at 500° C. are similar, which indicates no parasitic CVD formation. Thus, 3TMSAS at 650° C. produces ALD of $SiO_2$. FIG. 10 is XPS results after pyrolysis of 3TMSAS at 750° C., showing 3TMSAS decomposes to Si, O, C and N.

Figure 11A:
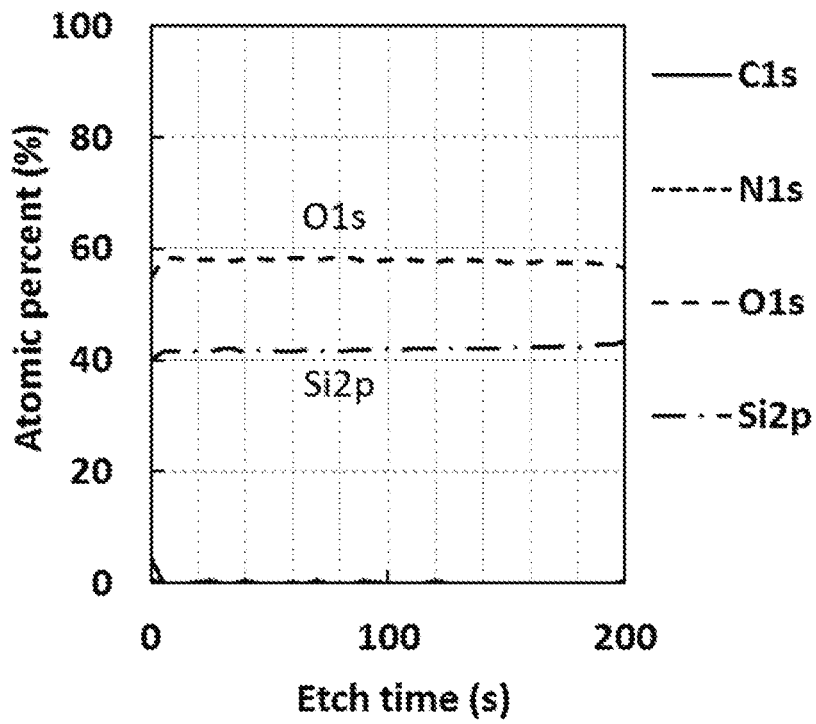
FIG. 11a is XPS results after ALD of $SiO_2$ film using 3TMSAS at 600° C.
Figure 11B:
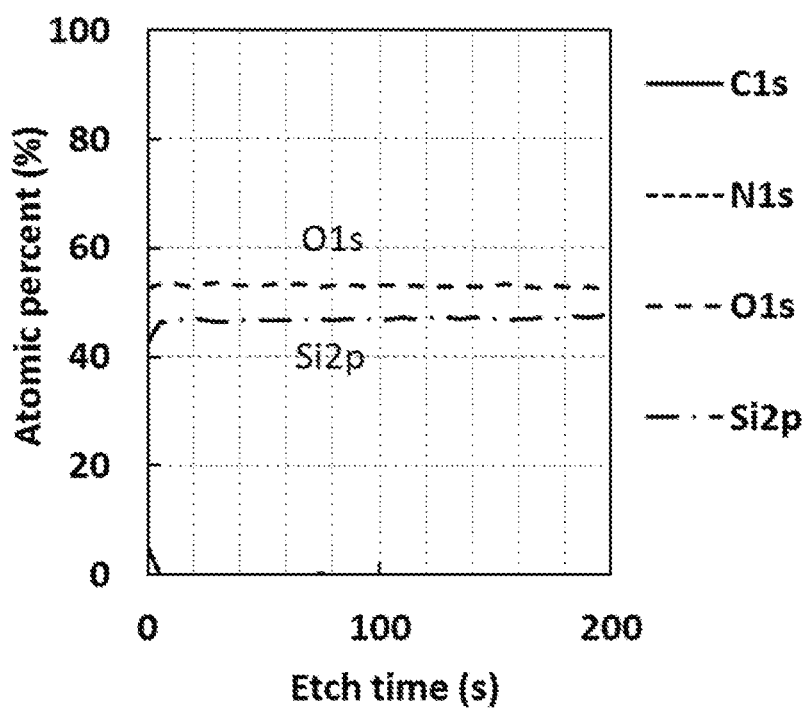
FIG. 11b is XPS results after ALD of $SiO_2$ film using 3TMSAS at 650° C.
Figure 11C:
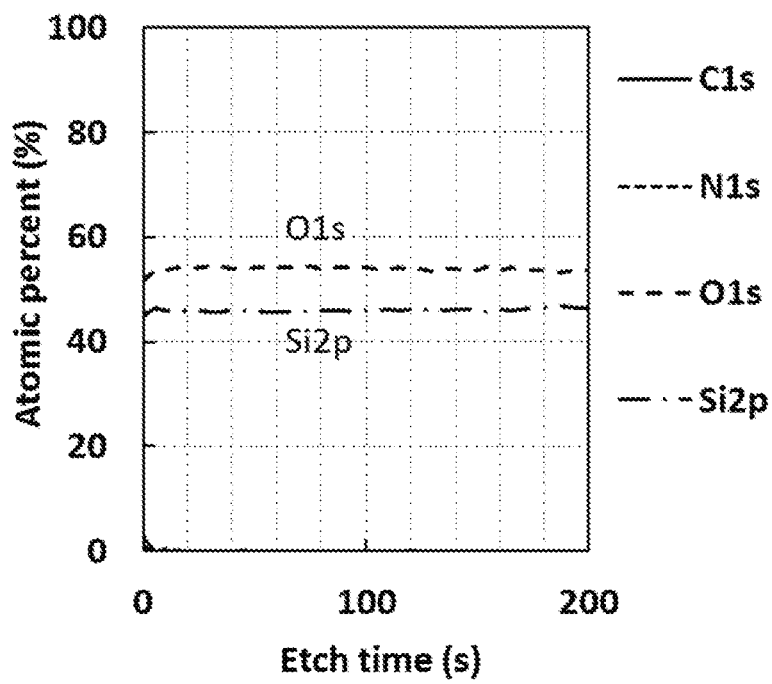
FIG. 11c is XPS results after ALD of $SiO_2$ film using 3TMSAS at 700° C.

FIG. 11a to FIG. 11c are XPS results after ALD of $SiO_2$ film using 3TMSAS at 600° C., 650° C. and 700° C., respectively. The XPS results at 600° C., 650° C. and 700° C. show only Si and O existing in the ALD deposited $SiO_2$ film. Thus, 3TMSAS used as a deposition precursor for ALD of $SiO_2$ is able to keep a conformal growth at a temperature higher than approximately 500° C. Furthermore, 3TMSAS used as a deposition precursor for ALD of $SiO_2$ is able to keep a conformal growth at a temperature up to approximately 700° C. Combining FTIR and XPS results, it is concluded that 3TMSAS used as an ALD precursor performs a perfect ALD of $SiO_2$ in a temperature range from approximately 500° C. to approximately 700° C. or approximately 600° C. to approximately 700° C. 3TMSAS used as an ALD precursor performs a perfect ALD of $SiO_2$ at a temperature of approximately 700° C.

Figure 12A:
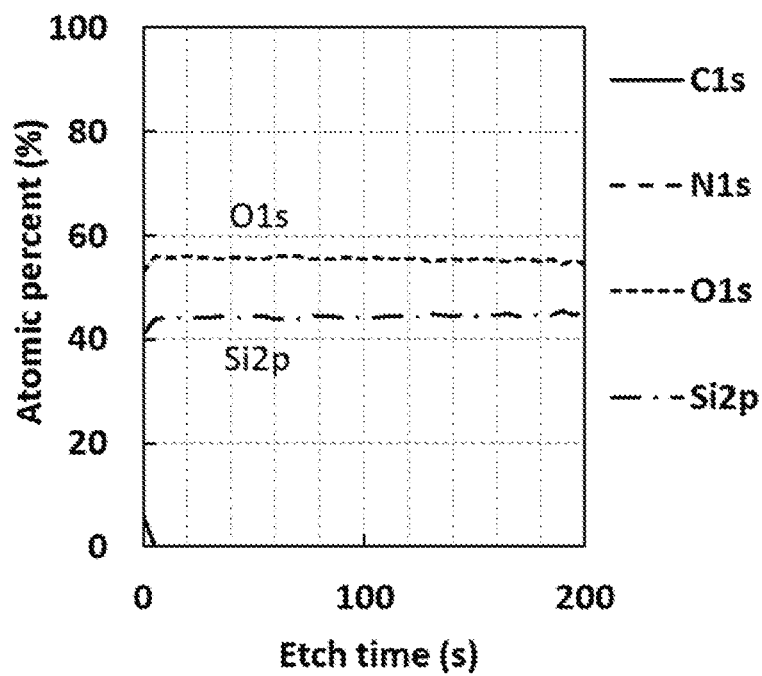
FIG. 12a is XPS results after ALD of $SiO_2$ film using BTBAS at 500° C.
Figure 12B:
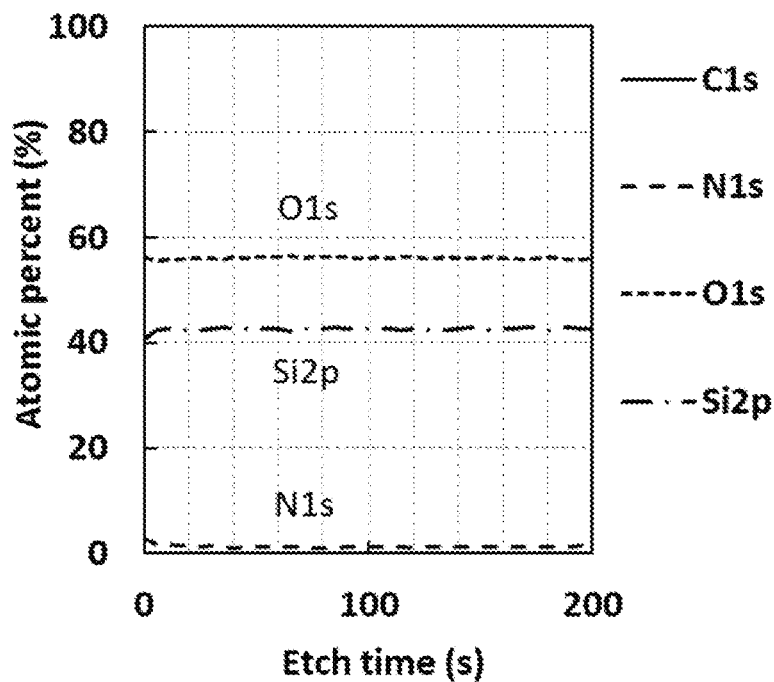
FIG. 12b is XPS results after ALD of $SiO_2$ film using BTBAS at 550° C.
Figure 12C:
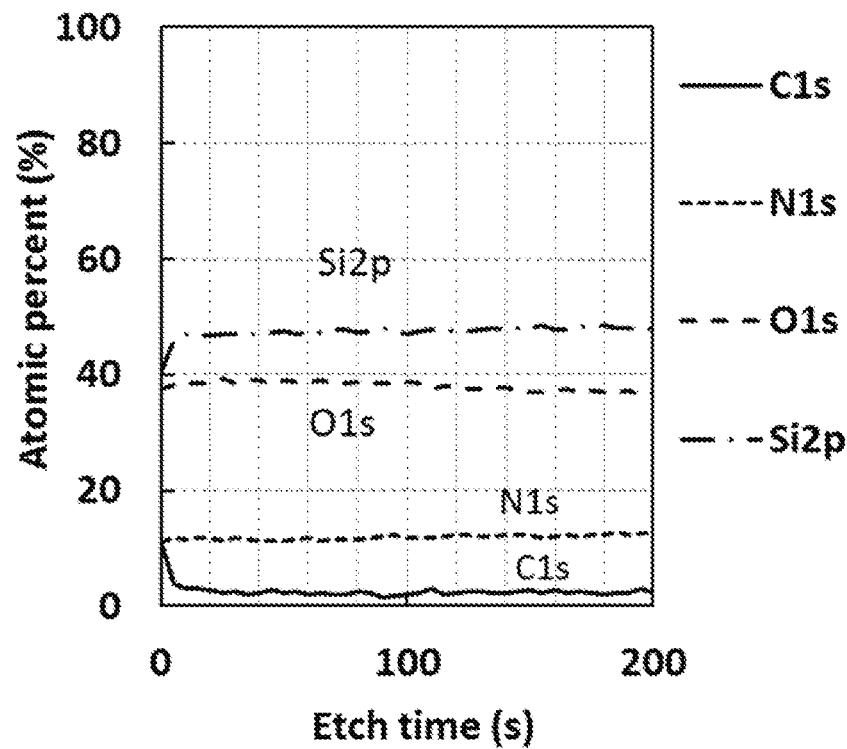
FIG. 12c is XPS results after ALD of $SiO_2$ film using BTBAS at 650° C.

FIG. 12a to FIG. 12c are XPS results after ALD of $SiO_2$ film using BTBAS at 500° C., 550° C. and 650° C., respectively. At 500° C., BTBAS produced ALD of $SiO_2$ film without C and N detected. At 550° C., N appears which means parasitic CVD starts to come up in the $SiO_2$ film. The XPS results at 650° C. show Si, O, N and C elements, indicating the composition of the deposited film changes and parasitic CVD is formed. Referring to FIG. 9, since BTBAS already decomposes at 600° C., BTBAS is limited to use as an ALD precursor at a temperature no higher than approximately 600° C. Referring to FIG. 12b, BTBAS may be limited to use as an ALD precursor at a temperature no higher than approximately 550° C.

Example 8. XPS Analyses of ALD of $SiO_2$ Film Using 2TMSAS with $O_3$ at 650° C. and 600° C.

Figure 13A:
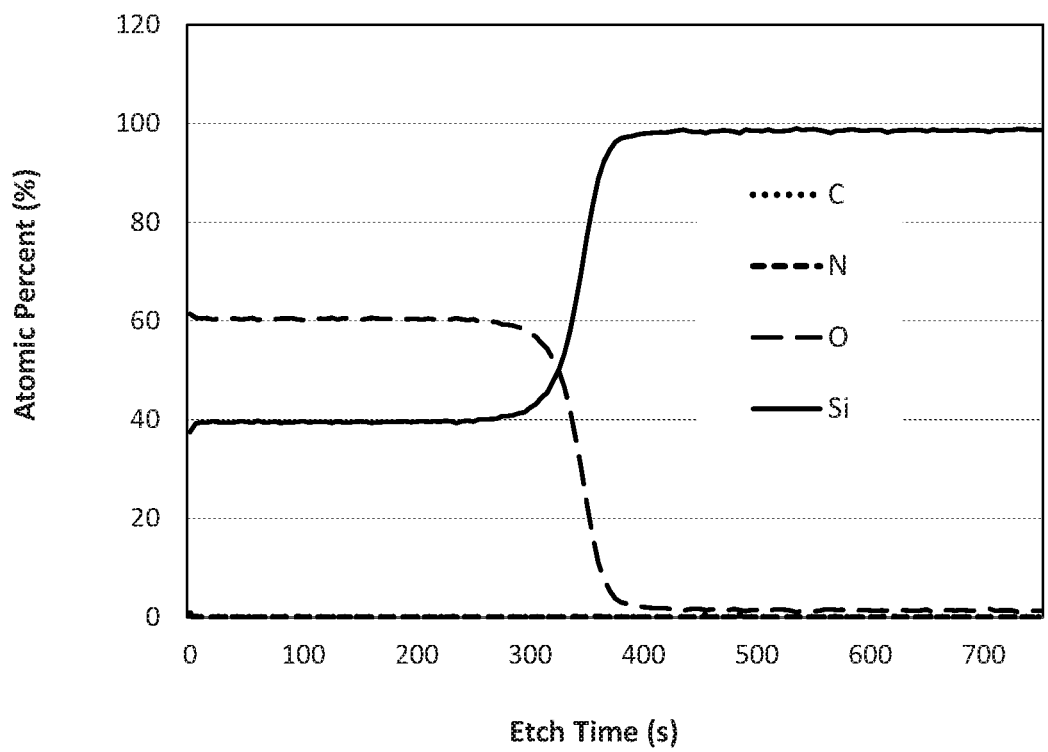
FIG. 13a is XPS results after ALD of $SiO_2$ film using 2TMSAS at 650° C.
Figure 13B:
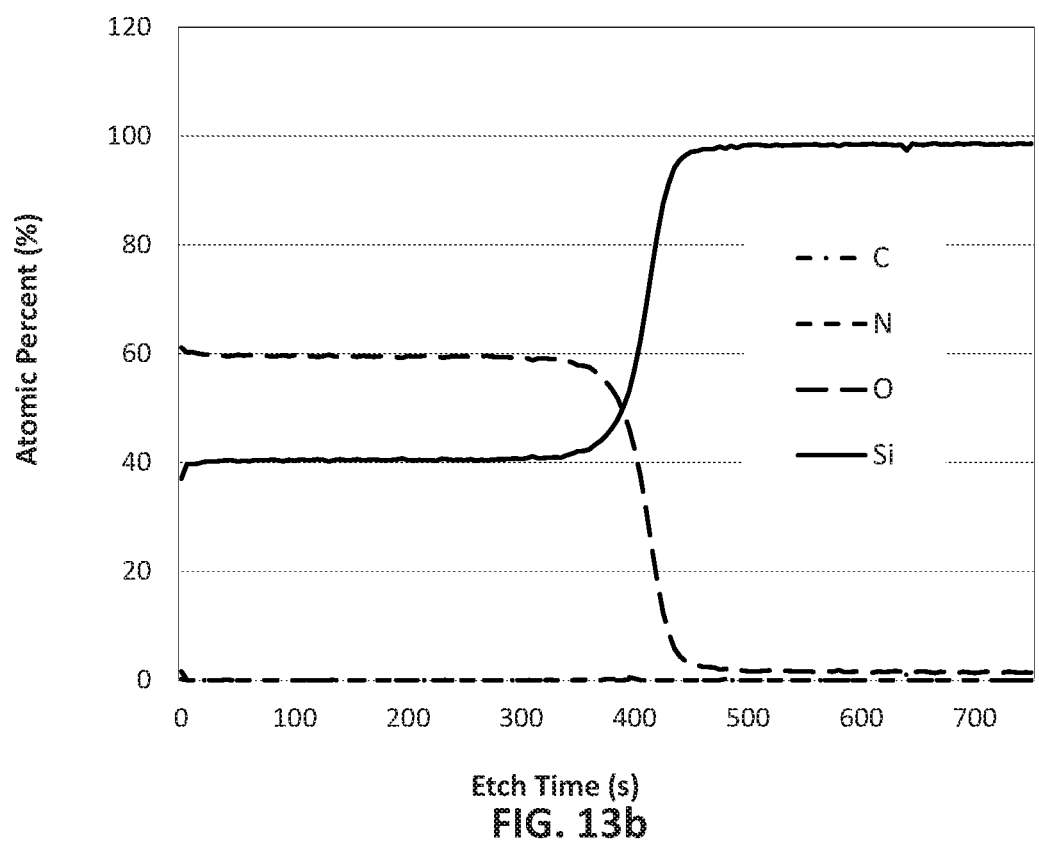
FIG. 13b is XPS results after ALD of $SiO_2$ film using 2TMSAS at 600° C.
Figure 13C:
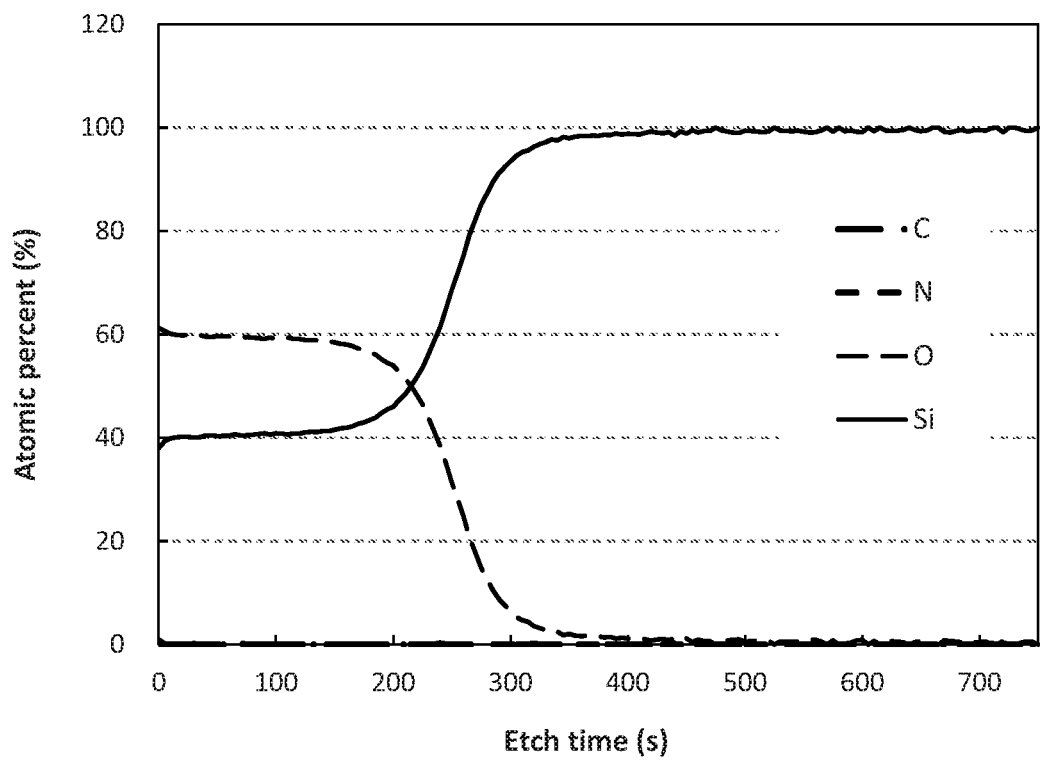
FIG. 13c is XPS results after ALD of $SiO_2$ film using 2TMSAS at 500° C.
Figure 13D:
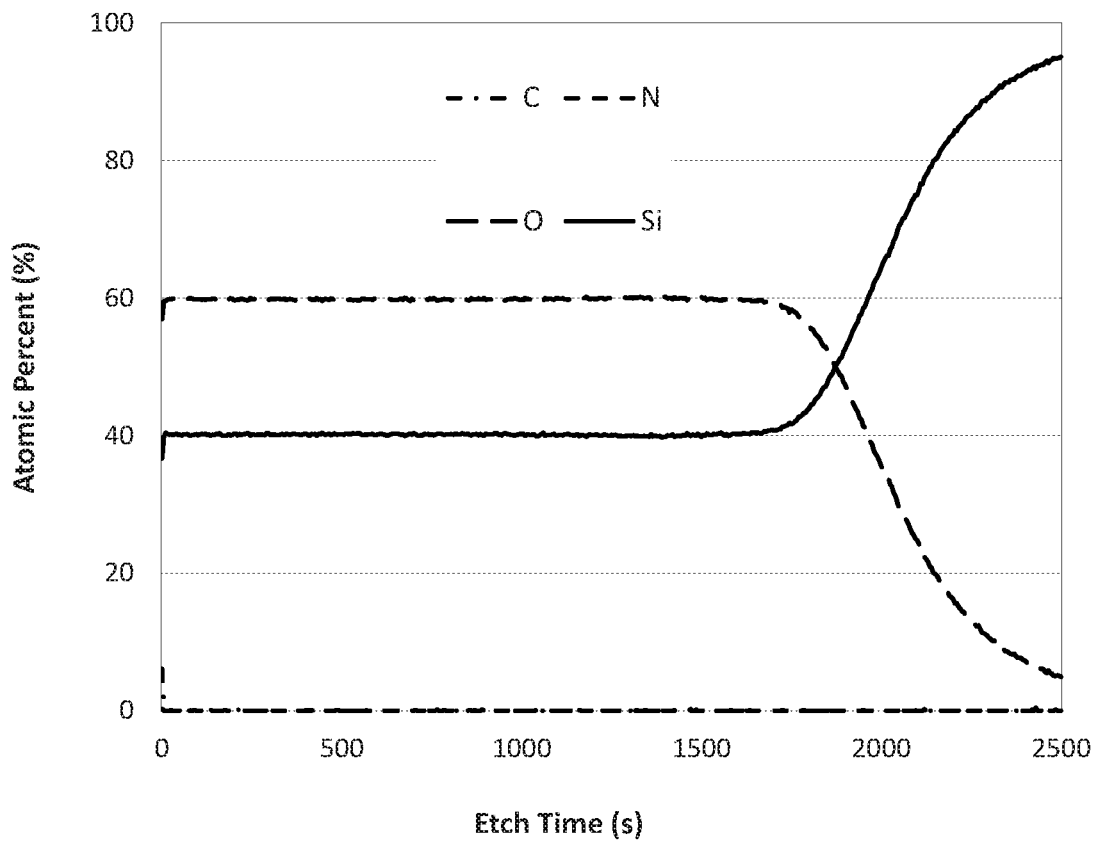
FIG. 13d is XPS results of thermal $SiO_2$.

FIG. 13a is XPS results after ALD of $SiO_2$ film using 2TMSAS at 650° C. FIG. 13b is XPS results after ALD of $SiO_2$ film using 2TMSAS at 600° C. FIG. 13c is XPS results after ALD of $SiO_2$ film using 2TMSAS at 500° C.; FIG. 13d is XPS results of thermal $SiO_2$;

The XPS results at 600° C. and 650° C. show only Si and O existing in the ALD deposited $SiO_2$ film, which is similar to the XPS results of the thermal-oxide silicon shown in FIG. 13d. The atomic ratios in the ALD $SiO_2$ film have shown below in Table 2.

TABLE 2

Atomic Ratios of ALD films at 650° C. and 600° C.

| Temperature (° C.) | Atomic Ratio (%) | | | |
|---|---|---|---|---|
| | Si | O | N | C |
| 650 | 40.2 | 59.7 | 0 | 0 |
| 600 | 39.5 | 60.4 | 0 | 0 |
| 500 | 40.4 | 59.6 | 0 | 0 |
| Thermal $SiO_2$ | 40 | 60 | 0 | 0 |

Thus, 2TMSAS used as a deposition precursor for ALD of $SiO_2$ is able to keep a conformal growth at a temperature from 600° C. to 650° C. 2TMSAS used as a deposition precursor for ALD of $SiO_2$ at 500° C. fails to perform a conformal growth. Furthermore, 2TMSAS used as a deposition precursor for ALD of $SiO_2$ is able to keep a conformal growth at a temperature up to approximately 650° C. Based on XPS results, it is concluded that 2TMSAS used as an ALD precursor performs a perfect ALD of $SiO_2$ in a temperature range from approximately 600° C. to approximately 650° C. 2TMSAS used as an ALD precursor performs a perfect ALD of $SiO_2$ at a temperature of approximately 600° C.

Example 9. Step Coverage (SC) of 2TMSAS with 0 in 24:1 Trench at Various Temperatures Table 3 shows the results of the step coverages (%) at top, middle and bottom walls in 24:1 trench using 2TMSAS as a precursor for ALD obtained from SEM images at 600° C., 650° C. and 500° C., respectively. All trenched wafers were located at the same position in the ALD chamber, i.e., 350-380 mm from the inlet of the ALD chamber. As shown, the step coverages at 600° C. is better than those at 500° C. and the step coverages at 650° C. is better than those at 600° C. and 500° C., meaning 2TMSAS is suitable for high temperature deposition, such as 650° C. ALD.

TABLE 3

Step Coverages of 2TMSAS

| Temperature of substrate (° C.) | Average Thickness (top) | Substrate Position (cm) | Step Coverage in 24:1 Trench (%) | | |
|---|---|---|---|---|---|
| | | | Top | Middle | Bottom |
| 650 | 43.6 | 35 | 100 | 96 | 94 |
| 600 | 37.5 | 35 | 100 | 91 | 90 |
| 500 | 18 | 35 | 100 | 88 | 91 |

Example 10. Comparison of Sidewall Step Coverage (SC) Between 3TMSAS and BTBAS

Figure 14:
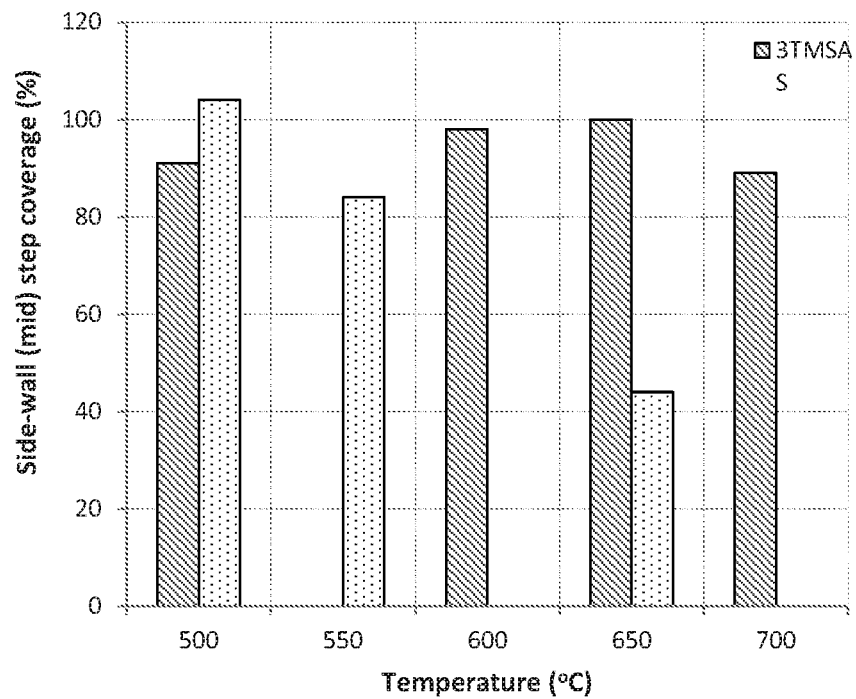
FIG. 14 is a graph of sidewall step coverage (SC) (%) versus temperature for 3TMSAS ALD.

FIG. 14 is a graph of sidewall step coverage (%) versus temperature for 3TMSAS ALD of $SiO_2$ film. At 500° C., the film deposited from 3TMSAS was pure ALD of $SiO_2$. When the temperature is higher than 500° C., such as, at 550° C., the film deposited from BTBAS becomes non-conformal, because the temperature higher than 500° C. is higher than the self-decomposition temperature of BTBAS as shown in FIG. 1 and CVD components appeared. At 650° C., the film deposited from BTBAS was entirely made via the parasitic CVD process. On the other hand, 3TMSAS keeps showing conformal growth as the temperature is higher than 500° C., even at about 700° C., indicating that 3TMSAS performs, in a temperature range between 500 to 700° C., a perfect ALD (i.e. the parasitic CVD process is nonexistent or sufficiently low so as to not affect the quality of the ALD film).

Example 11. Normalized WERs at Various Temperatures for 2TMSAS

Figure 15:
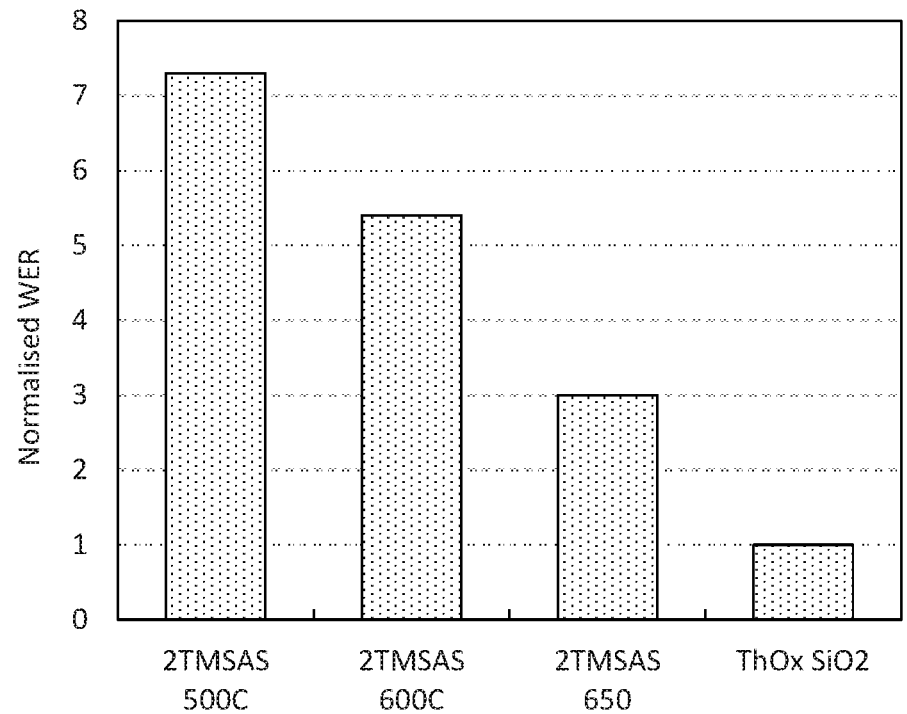
FIG. 15 is a graph of normalized WERs at various temperatures for 2TMSAS ALD of $SiO_2$ film.

FIG. 15 is a graph of normalized WERs at various temperatures for 2TMSAS ALD of $SiO_2$ film. The WER is normalized with thermally grown $SiO_2$. The WER is an alternative measurement for the film quality. The lower the WER, the better the film quality. Alternatively, the closer the WER to the WER of thermally grown $SiO_2$ (the WER for thermally grown $SiO_2$ is 1), the better the $SiO_2$ film quality. Low WER is better for cleaning after deposition because the low WER results in less loss of the deposited film during cleaning. As shown, the higher the temperature, the lower the WER. Furthermore, the higher the temperature, the better ALD thickness (see Table 3) and the better growth per cycle (GPC) of ALD as seen in the example that follows. Thus, 2TMSAS is suitable for being used as an ALD precursor at a high temperature, such as a temperature between approximately 600° C. and approximately 650° C.

Example 12. Comparison of Wet Etch Rate (WER) Between 3TMSAS and BTBAS

Figure 16:
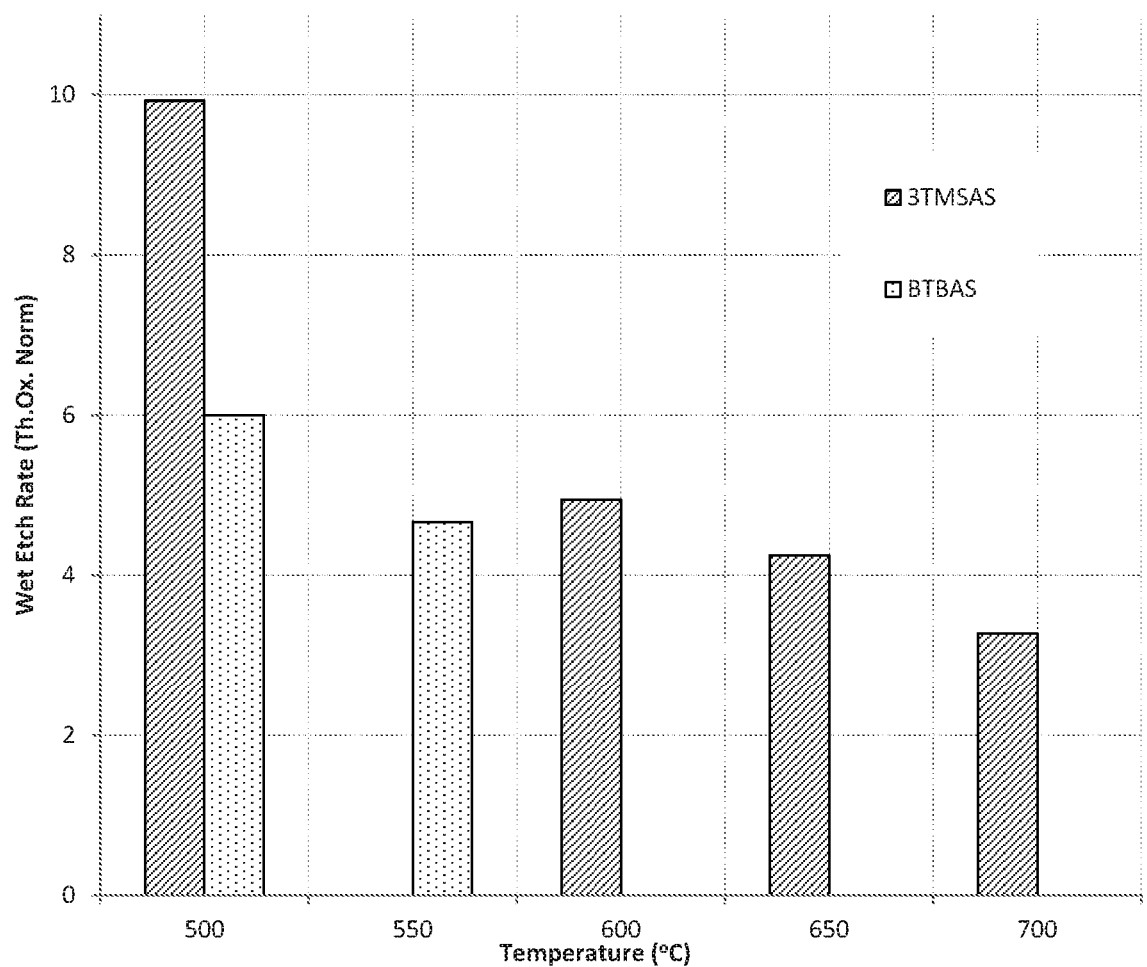
FIG. 16 is a graph of wet etch rate (WER) versus temperature for 3TMSAS ALD.

FIG. 16 is a graph of wet etch rate (WER) (thermally grown $SiO_2$ Normalized) versus temperature for 3TMSAS ALD of $SiO_2$ film. The WER is an alternative measurement for the film quality. The lower the WER, the better the film quality. Alternatively, the closer the WER to the WER of thermally grown $SiO_2$ (the WER for thermally grown $SiO_2$ is 1), the better the $SiO_2$ film quality. Low WER is better for cleaning after deposition because the low WER results in less loss of the deposited film during cleaning. The WER of BTBAS at the temperature of 500° C. is better than that of 3TMSAS at this temperature. However, 3TMSAS at 700° C. produced a better film quality than BTBAS at its maximum applicable temperature (here around 500° C.). As shown, the WER of 3TMSAS at 700° C. is less than 4.

Example 13. Comparison of WER Between 2TMSAS and 3TMSAS at 650° C. and 600° C.

Figure 17:
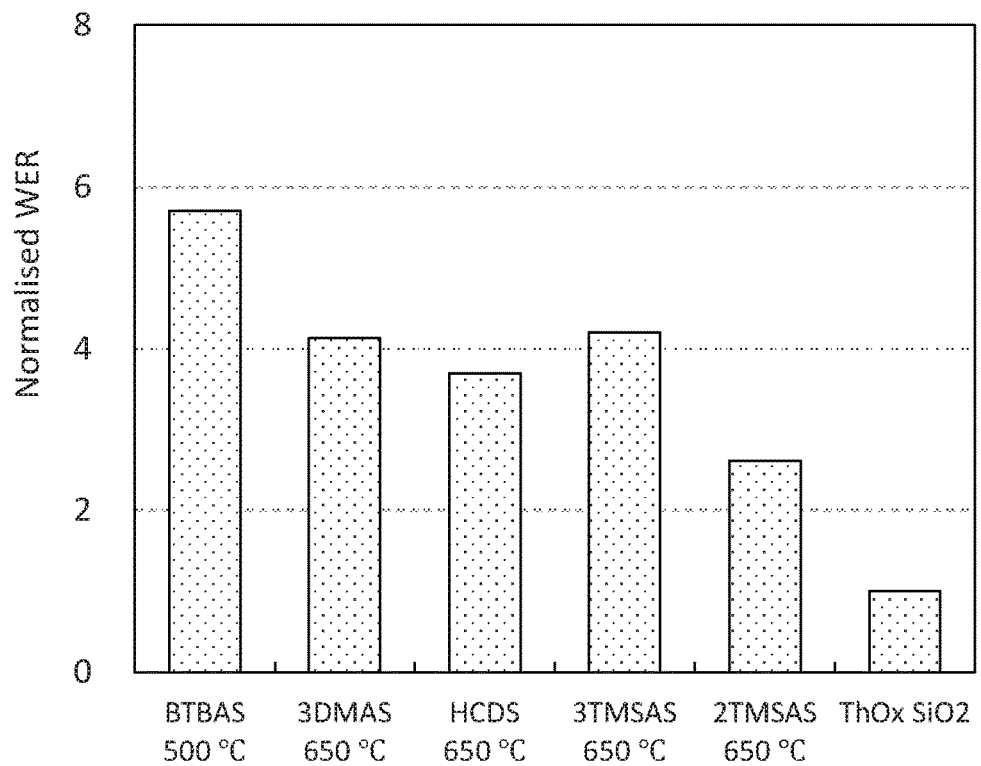
FIG. 17 is a graph of normalized WER versus temperature for 2TMSAS, 3TMSAS and BTBAS ALD of $SiO_2$ film.

FIG. 17 is a comparison of normalized WER for 2TMSAS and 3TMSAS with trisdimethylaminosilane (3DMAS), hexachlorodisilane (HCDS) and BTBAS ALD of $SiO_2$ film. The WERs of 2TMSAS at the temperature of 650° C. is lower than all three comparing silanes, 3DMAS at 650° C., HCDS at 650° C. and BTBAS at 500° C. The WER of 3TMSAS at 650° C. is equivalent to those of 3DMAS at 650° C., HCDS at 650° C., but lower than that of BTBAS at 500° C., thereby, 2TMSAS and 3TMSAS at 650° C. produce a better film quality than BTBAS at 500° C. Thus, 2TMSAS and 3TMSAS are suitable for high temperature ALD.

Figure 18:
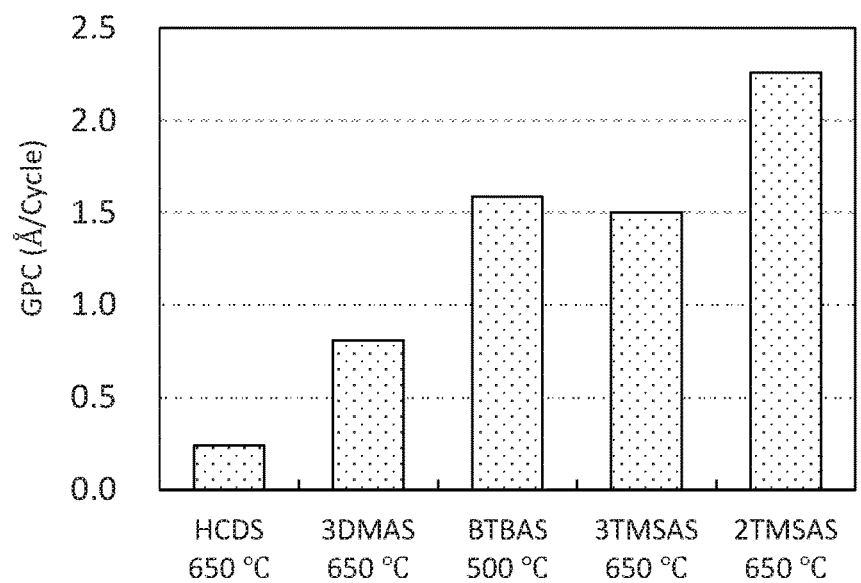
FIG. 18 is a comparison of GPC for 2TMSAS at 650° C. and 600° C. comparing to the GPC of 3TMSAS at 650° C. and BTBAS at 500° C.

Example 14. Comparison of GPC for 2TMSAS and 3TMSAS with BTBAS, 3DMAS and HCDS with $O_3$ The GPC depends on various conditions, such as the starting substrate, the temperature of the deposition, etc. If the GPC is lower than the theoretical maximum of one monolayer per cycle, it may result in film roughness and slow film closure, which makes especially thin films (thinner than about 5 nm) prone to localized defects such as pinholes. FIG. 18 is a comparison of GPCs for 2TMSAS at 650° C. and 3TMSAS at 650° C. with GPCs for HCDS at 650° C., 3DMAS at 650° C. and BTBAS at 500° C. The GPC of 2TMSAS at the temperatures of 650° C. are higher than those of all three comparing silanes, 3DMAS at 650° C., HCDS at 650° C. and BTBAS at 500° C. The GPC of 3TMSAS at the temperatures of 650° C. is equivalent to that of BTBAS at 500° C., but higher than those of 3DMAS at 650° C. and HCDS at 650° C.

Example 15. Trace Impurity Analyses of 2TMSAS with $O_3$ at 650° C. and 600° C.

The trace impurity analyses were done by Secondary Ion Mass Spectrometer (SIMS) for ALD films at 20 nm with 2TMSAS at 650° C. and 600° C. The results listed in Table 4 show that 2TMSAS ALD films at 600° C. and 650° C. have low concentrations of H, C and N. For comparison, the trace of impurities of 3TMSAS and BTBAS at various temperatures are also listed. As shown, 2TMSAS films have high purity compared to 3TMSAS and BTBAS films.

TABLE 4

Trace Impurity Analyses

| Sample | Temperature (° C.) | H (atoms/cm$^3$) | C (atoms/cm$^3$) | N (atoms/cm$^3$) |
|---|---|---|---|---|
| BTBAS | 500 | 1.2E+21 | 1.4E+19 | 1.2E+20 |
| 3TMSAS | 650 | 7.8E+20 | 3.4E+18 | 2.4E+20 |
| 3TMSAS | 700 | 6.1E+20 | 9.8E+18 | 5.3E+20 |
| 2TMSAS | 600 | 5.1E+20 | 2.2E+18 | 7.0E+19 |
| 2TMSAS | 650 | 2.6E+20 | 2.4E+18 | 5.3E+19 |

Example 16. Surface Roughness Analyses of 2TMSAS with $O_3$ at 650° C. and 600° C.

Table 5 is the surface roughness results (root mean square (RMS)) measured by Atomic Force Microscopy (AFM). 2TMSAS film at 650° C. was very smooth.

TABLE 5

Surface Roughness

| Sample | Temperature (° C.) | RMS Roughness (nm) |
|---|---|---|
| BTBAS | 500 | 0.49 |
| 3TMSAS | 650 | 1.08 |
| 3TMSAS | 700 | 0.48 |
| 2TMSAS | 600 | 0.45 |
| 2TMSAS | 650 | 0.21 |
| Si Sub. (Ref.) |  | 0.12 |

Example 17. ALD of 2TMSAS with $O_2$ at 650° C.

650° C. is the highest temperature at which no pyrolysis occurs with 2TMSAS as shown in FIG. 4. The conditions for ALD of 2TMSAS with $O_2$ at 650° C. are as follows. The pulse/purge for 2TMSAS was 10 s/60 s; the flow rate of the sample 2TMSAS was 2 sccm; the process bubble flow rate was 35 sccm; the process pressure was 5 Torr; the ALD cycles was 200 cycles; the pulse/purge for $O_2$ was 15 s/30 s; the flow rate of 02 was 100 sccm; the wafer was cleaned with 1% HF aq. The deposition film thickness was measured using Ellipsometry, which is around 11.5 nm.

Figure 19A:
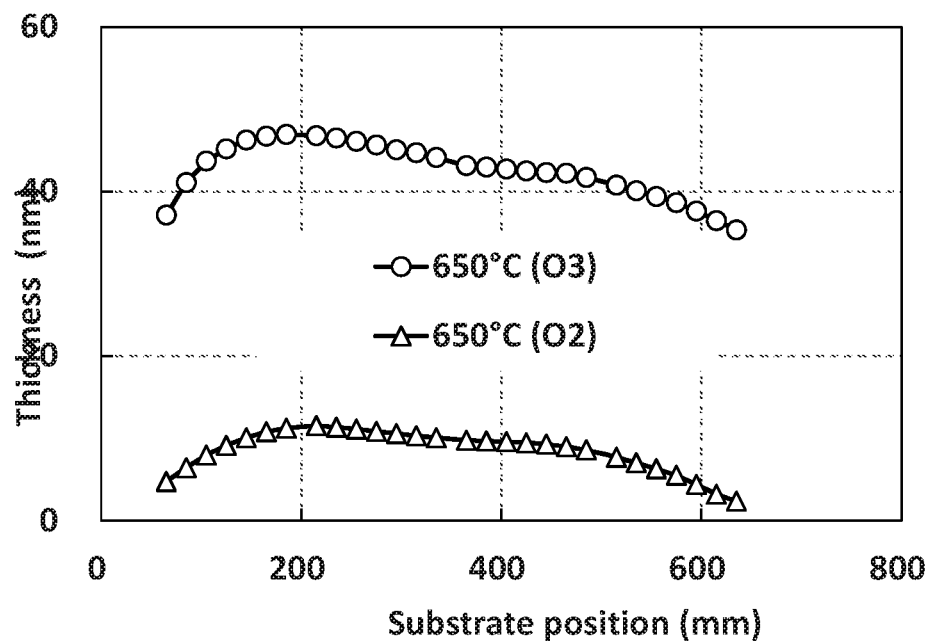
FIG. 19a is ALD of 2TMSAS with $O_3$ and $O_2$, respectively, at 650° C.
Figure 19B:
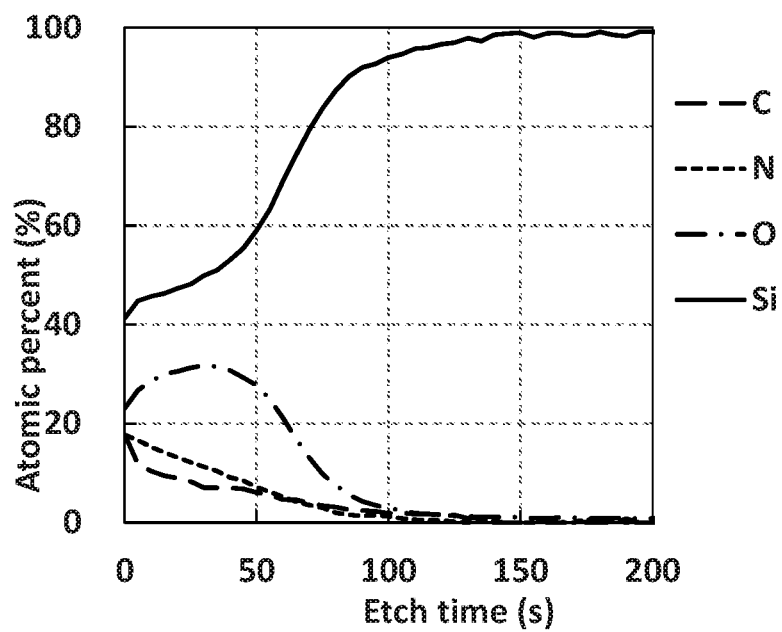
FIG. 19b is XPS analyses of ALD of $SiO_2$ film using 2TMSAS with $O_2$ at 650° C.

FIG. 19a shows ALD of 2TMSAS with $O_2$ at 650° C. For comparison, ALD of 2TMSAS with $O_3$ at 650° C. is also shown. The GPC of 2TMSAS with $O_2$ at 650° C. is 3.7 times lower than 2TMSAS with $O_3$ at 650° C. FIG. 19b is XPS analyses of ALD of $SiO_2$ film using 2TMSAS with $O_2$ at 650° C. XPS analyses show N and C exist in ALD film deposited with 2TMSAS with $O_2$. For example, at 50 s etch time, Si is 59%, 0 is 27.7%, N is 7.2% and C is 6.1%. Since the oxidization of $O_2$ is lower than that of $O_3$, ALD with 2TMSAS and $O_2$ has some N and C not oxidized and therefore left in the ALD film.

This may be preferred for an ALD film that requires certain amounts of N and C.

Example 18. ALD of 2TMSAS with $O_3$ Pulse-Period Dependence at 650° C.

Figure 20:
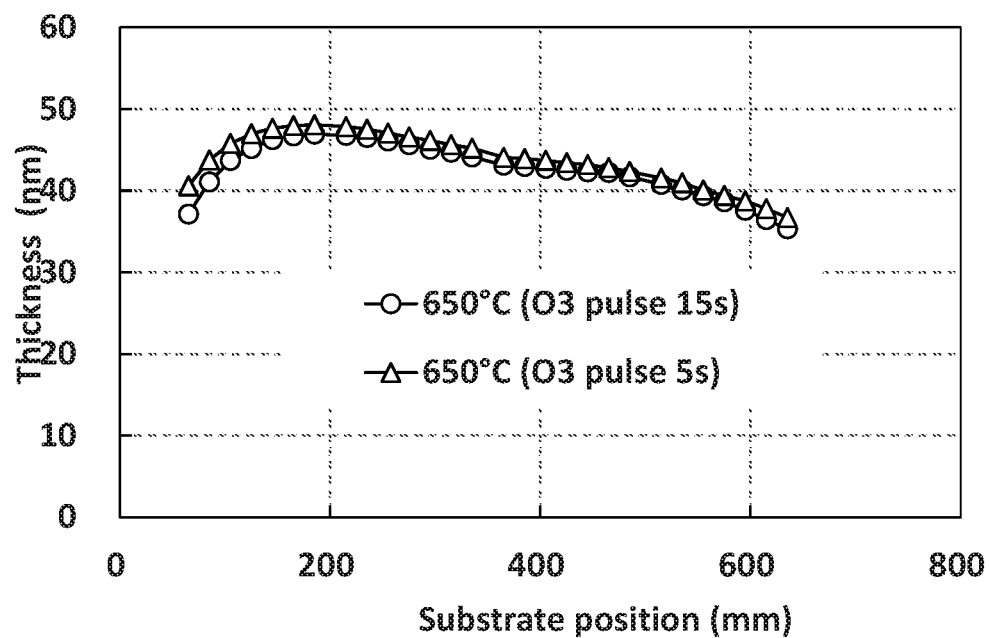
FIG. 20 is ALD film thickness over the substrate position of 2TMSAS with pulse time dependence $O_3$ at 650° C.

FIG. 20 is ALD film thickness over the substrate position of 2TMSAS with 03 pulse-period dependence at 650° C. With 5 second and 15 second of $O_3$ pulses, the ALD film thickness profile are nearly the same. This means 5 second of $O_3$ pulse is suitable to add to 2TMSAS for ALD of $SiO_2$ film, which will deliver significant cost savings comparing to 15 second of $O_3$ pulses.

Example 19. ALD of 2TMSAS with $O_3$ Density Dependence at 650° C.

Figure 21:
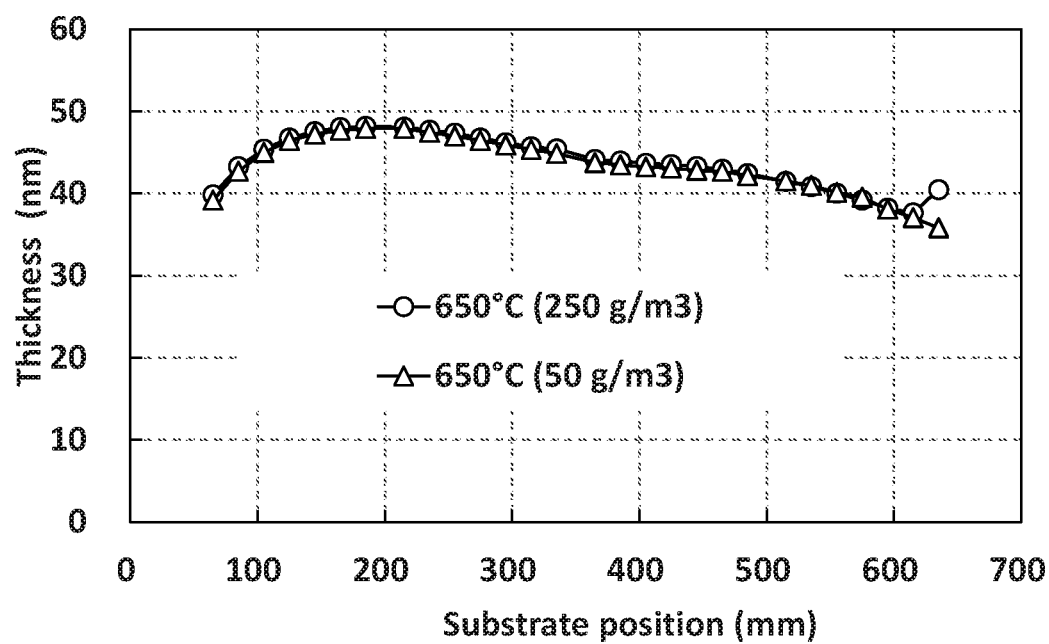
FIG. 21 is ALD film thickness over the substrate position of 2TMSAS with $O_3$ density dependence at 650° C.
Figure 22A:
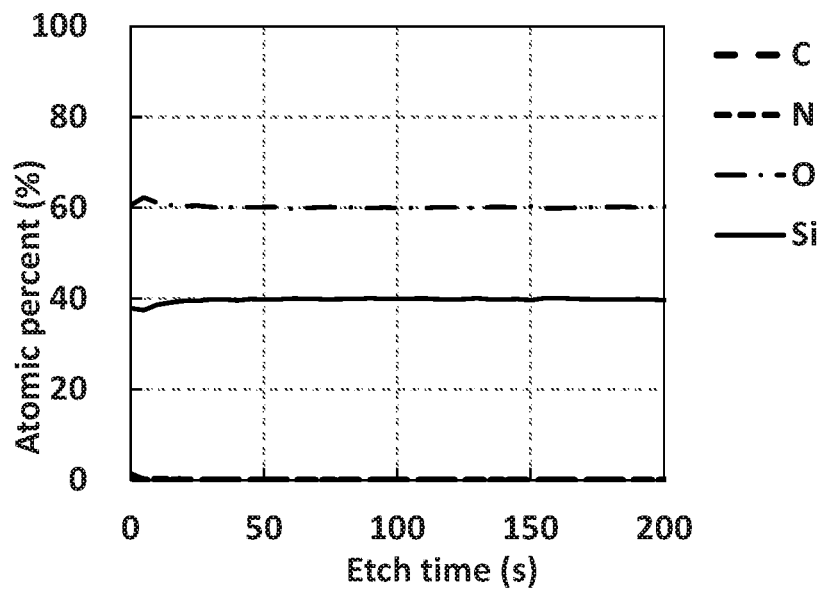
FIG. 22a is XPS results after ALD of $SiO_2$ film using 2TMSAS with 50 g/m³ $O_3$ density at 650° C.
Figure 22B:
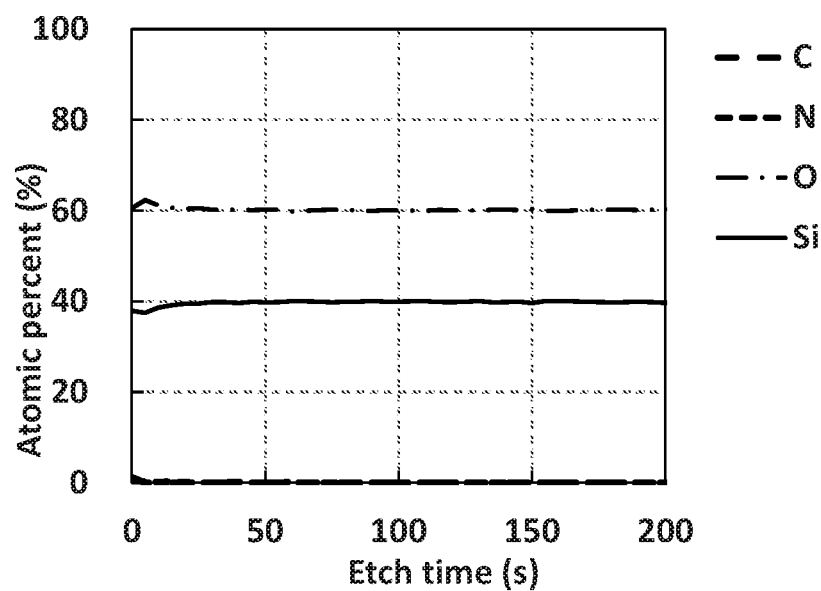
FIG. 22b is XPS results after ALD of $SiO_2$ film using 2TMSAS with 250 g/m³ $O_3$ density at 650° C.

FIG. 21 is ALD film thickness over the substrate position of 2TMSAS with 03 density dependence at 650° C. With 50 g/m$^3$ and 250 g/m$^3$ of $O_3$, the ALD film thickness profile are nearly the same. This means 50 g/m$^3$ of $O_3$ is suitable to add to 2TMSAS for ALD of $SiO_2$ film, which will deliver significant cost savings. FIG. 22a is XPS results after ALD of $SiO_2$ film using 2TMSAS with 50 g/m$^3$ $O_3$ density at 650° C. FIG. 22b is XPS results after ALD of $SiO_2$ film using 2TMSAS with 250 g/m$^3$ $O_3$ density at 650° C. As shown, in both figures, $SiO_2$ films contains 40% silicon and 60% oxygen, no N and C. Table 6 shows step coverages of 2TMSAS with $O_3$ density dependence for ALD of $SiO_2$ obtained from SEM images at 650° C. in a 24:1 trench. The trenched wafer was located at 35-38 cm from the inlet of the ALD chamber. The results show that the step coverages for approximately 50 g/m$^3$ and approximately 250 g/m$^3$ of $O_3$ density are almost the same. All XPS results and step coverage results show 50 g/m$^3$ $O_3$ is suitable to add to 2TMSAS for ALD of $SiO_2$ film, which will deliver significant cost savings comparing to 250 g/m$^3$ $O_3$.

TABLE 6

Step Coverages of 2TMSAS with $O_3$ density dependence

| Temperature of substrate | $O_3$ density | Average Thickness | Position | Step Coverage in 24:1 Trench (%) | | |
|---|---|---|---|---|---|---|
| (° C.) | (g/m$^3$) | (top) | (cm) | Top | Middle | Bottom |
| 650 | 54 | 43.1 | 35 | 100 | 93 | 95 |
| 650 | 249 | 43.6 | 35 | 100 | 100 | 98 |

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

While embodiments of this invention have been shown and described, modifications thereof may be made by one skilled in the art without departing from the spirit or teaching of this invention. The embodiments described herein are exemplary only and not limiting. Many variations and modifications of the composition and method are possible and within the scope of the invention. Accordingly, the scope of protection is not limited to the embodiments described herein, but is only limited by the claims which follow, the scope of which shall include all equivalents of the subject matter of the claims

What is claimed is:

1. A method for forming a Si-containing film on a substrate, the method comprising the steps of:
heating the substrate in a reactor to a temperature of 550° C. or higher;
exposing the substrate to a vapor including a Si-containing film forming composition that contains a Si-containing precursor selected from SiH(NH—Si(CH$_3$)$_3$)$_3$, SiHCl(NH—Si(CH$_3$)$_3$)$_2$, SiCl$_2$(NH—Si(CH$_3$)$_3$)$_2$, or Si(NH—Si(CH$_3$)$_3$)$_4$; and depositing at least part of the Si-containing precursor onto the substrate to form the Si-containing film on the substrate through an atomic layer deposition (ALD) process.

2. The method of claim 1, further comprising the step of exposing the substrate to a co-reactant.

3. The method of claim 2, wherein the co-reactant is selected from O, O$_2$, H$_2$O, NO, N$_2$O, NO$_2$, H$_2$O$_2$, O radicals and combinations thereof.

4. The method of claim 2, wherein the co-reactant is selected from NH$_3$, NO, N$_2$O, hydrazines, N$_2$ plasma, N$_2$/H$_2$ plasma, NH$_3$ plasma, amines and combinations thereof.

5. The method of claim 1, further comprising the step of heating the substrate to a temperature greater than 550° C. to no more than 650° C.

6. The method of claim 1, further comprising the step of heating the substrate to a temperature greater than 550° C. to no more than 750° C.

7. The method of claim 1, wherein the silicon-containing film is a silicon oxide layer.

8. The method of claim 7, wherein a WER of the silicon oxide film as deposited, normalized with thermal SiO$_2$, is from 2 to 4.

9. The method of claim 1, wherein the ALD process is a thermal ALD.

10. A method for forming a Si-containing film on a substrate, the method comprising the steps of:

heating a substrate in a reactor to a temperature of higher than 550° C.; and forming a chemisorbed and/or physisorbed film, on the surface of the substrate, of a Si-containing precursor selected from SiH(NH—Si(CH$_3$)$_3$)$_3$, SiHCl(NH—Si(CH$_3$)$_3$)$_2$, SiCl$_2$(NH—Si(CH$_3$)$_3$)$_2$, or Si(NH—Si(CH$_3$)$_3$)$_4$.

11. The method of claim 10, further comprising the step of chemically reacting the chemisorbed and/or physisorbed film comprising the Si-containing precursor with a co-reactant.

12. The method of claim 11, wherein the co-reactant reacting with the Si-containing precursor in the chemisorbed and/or physisorbed film produces a reaction product that forms a second film on the surface of the substrate.

13. The method of claim 12, wherein the co-reactant is selected from O$_3$, O$_2$, H$_2$O, NO, N$_2$O, NO$_2$, H$_2$O$_2$, O radicals and combinations thereof.

14. The method of claim 12, wherein the co-reactant is selected from NH$_3$, NO, N$_2$O, hydrazines, N$_2$ plasma, N$_2$/H$_2$ plasma, NH$_3$ plasma, amines and combinations thereof.

* * * * *